United States Patent
Ohtsu et al.

(10) Patent No.: US 12,494,400 B2
(45) Date of Patent: Dec. 9, 2025

(54) METHOD FOR INSPECTING CHEMICAL SOLUTION, METHOD FOR PRODUCING CHEMICAL SOLUTION, METHOD FOR CONTROLLING CHEMICAL SOLUTION, METHOD FOR PRODUCING SEMICONDUCTOR DEVICE, METHOD FOR INSPECTING RESIST COMPOSITION, METHOD FOR PRODUCING RESIST COMPOSITION, METHOD FOR CONTROLLING RESIST COMPOSITION, AND METHOD FOR CHECKING CONTAMINATION STATUS OF SEMICONDUCTOR MANUFACTURING APPARATUS

(71) Applicant: FUJIFILM Corporation, Tokyo (JP)

(72) Inventors: Akihiko Ohtsu, Shizuoka (JP); Masahiro Yoshidome, Shizuoka (JP); Yukihisa Kawada, Shizuoka (JP); Ryo Saito, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 568 days.

(21) Appl. No.: 17/902,899

(22) Filed: Sep. 5, 2022

(65) Prior Publication Data

US 2023/0097195 A1 Mar. 30, 2023

(30) Foreign Application Priority Data

Sep. 6, 2021 (JP) .................................. 2021-144874
Aug. 24, 2022 (JP) .................................. 2022-133289

(51) Int. Cl.
*H01L 21/66* (2006.01)
*G01N 21/94* (2006.01)
(Continued)

(52) U.S. Cl.
CPC ............. *H01L 22/12* (2013.01); *G01N 21/94* (2013.01); *G01N 21/9501* (2013.01);
(Continued)

(58) Field of Classification Search
CPC ..... H01L 22/12; G01N 21/94; G01N 21/9501
See application file for complete search history.

(56) References Cited

U.S. PATENT DOCUMENTS

| 6,519,031 B2 * | 2/2003 | Gilton | G01N 1/32 250/288 |
| 6,749,715 B2 * | 6/2004 | Gilton | G01N 1/32 250/258 |

(Continued)

FOREIGN PATENT DOCUMENTS

| CN | 103443911 A | * 12/2013 | H01L 21/67 |
| CN | 115753959 A | * 3/2023 | H01L 22/12 |

(Continued)

*Primary Examiner* — Laura M Menz
(74) *Attorney, Agent, or Firm* — JCIPRNET

(57) ABSTRACT

Provided are a method for inspecting a chemical solution, the method being able to analyze minute foreign matter in the chemical solution, a method for producing a chemical solution, a method for controlling a chemical solution, a method for producing a semiconductor device, a method for inspecting a resist composition, the method being able to analyze minute foreign matter in the resist composition, a method for producing a resist composition, a method for controlling a resist composition, and a method for checking a contamination status of a semiconductor manufacturing apparatus, the method being able to control minute foreign matter in the semiconductor manufacturing apparatus.

The method for inspecting a chemical solution includes a step 1X of preparing a chemical solution; a step 2X of applying the chemical solution onto a semiconductor substrate; and a step 3X of measuring whether there is a defect on a surface of the semiconductor substrate to obtain posi- (Continued)

tional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry.

32 Claims, 13 Drawing Sheets

(51) Int. Cl.
*G01N 21/95* (2006.01)
*H01J 49/00* (2006.01)
*H01J 49/04* (2006.01)
*H01J 49/10* (2006.01)

(52) U.S. Cl.
CPC ...... *H01J 49/0036* (2013.01); *H01J 49/0422* (2013.01); *H01J 49/105* (2013.01)

(56) References Cited

U.S. PATENT DOCUMENTS

| | | | |
|---|---|---|---|
| 6,753,194 B2 * | 6/2004 | Ushiki | G21K 7/00 |
| | | | 438/14 |
| 6,943,043 B2 * | 9/2005 | Ushiki | G01N 21/9501 |
| | | | 850/13 |
| 7,700,380 B2 * | 4/2010 | Ushiki | H01L 21/02063 |
| | | | 250/306 |
| 7,795,593 B2 * | 9/2010 | Ushiki | H01L 22/12 |
| | | | 250/370.06 |
| 9,484,273 B2 * | 11/2016 | Lee | G01N 1/4044 |
| 9,721,817 B2 * | 8/2017 | Lee | H01L 21/67 |
| 2002/0123161 A1 * | 9/2002 | Ushiki | H01L 22/12 |
| | | | 438/14 |
| 2004/0206903 A1 * | 10/2004 | Ushiki | G21K 7/00 |
| | | | 250/306 |
| 2005/0230622 A1 * | 10/2005 | Ushiki | G01N 21/9501 |
| | | | 257/E21.228 |
| 2009/0039274 A1 * | 2/2009 | Ushiki | G21K 7/00 |
| | | | 250/370.06 |
| 2012/0260750 A1 * | 10/2012 | Lee | G01N 1/32 |
| | | | 73/866 |
| 2017/0069515 A1 * | 3/2017 | Lee | H01L 21/67288 |
| 2018/0308707 A1 * | 10/2018 | Yamaguchi | H01L 21/02181 |
| 2023/0097195 A1 * | 3/2023 | Ohtsu | H01J 49/0036 |
| | | | 438/14 |
| 2023/0229078 A1 * | 7/2023 | Yoshidome | G03F 7/16 |
| | | | 430/326 |
| 2023/0243780 A1 * | 8/2023 | Ohtsu | H01L 21/02041 |
| | | | 430/311 |
| 2023/0369086 A1 * | 11/2023 | Ohtsu | H01L 22/20 |
| 2025/0014884 A1 * | 1/2025 | Matsushita | G01N 27/62 |
| 2025/0028249 A1 * | 1/2025 | Ohtsu | G03F 7/38 |

FOREIGN PATENT DOCUMENTS

| | | | | |
|---|---|---|---|---|
| CN | 116762004 A | * | 9/2023 | |
| EP | 2689452 A2 | * | 1/2014 | ............ G01N 1/32 |
| EP | 2689452 A4 | * | 10/2014 | ............ G01N 1/32 |
| EP | 3139400 A1 | * | 3/2017 | ........... H01J 49/161 |
| JP | 09243535 A | * | 9/1997 | |
| JP | 2002257765 A | * | 9/2002 | ............ H01L 22/12 |
| JP | 2004327243 A | * | 11/2004 | |
| JP | 4738610 B2 | * | 8/2011 | ............ H01L 22/12 |
| JP | 2014514743 A | * | 6/2014 | ............ H01L 22/00 |
| JP | 2014228494 A | * | 12/2014 | |
| JP | 6047551 B2 | * | 12/2016 | ............ H01L 22/00 |
| JP | 2019195020 | | 11/2019 | |
| JP | 2020027920 | | 2/2020 | |
| JP | 2023038168 A | * | 3/2023 | |
| KR | 20120107190 A | * | 10/2012 | ....... H01L 21/67288 |
| KR | 101242246 B1 | * | 3/2013 | ....... H01L 21/67288 |
| KR | 102508350 B1 | * | 3/2023 | ............ B03C 3/011 |
| KR | 20230036050 A | * | 3/2023 | ............ H01L 22/12 |
| KR | 20240137048 A | * | 9/2024 | ........... G01N 27/623 |
| KR | 20240151810 A | * | 10/2024 | ............ G03F 7/422 |
| TW | 202401005 A | * | 1/2024 | ........... G01N 27/623 |
| WO | WO-2012128556 A2 | * | 9/2012 | ........ H01J 49/0036 |
| WO | WO-2012128556 A3 | * | 1/2013 | ............ G01N 1/32 |
| WO | WO-2022163143 A1 | * | 8/2022 | ............... G01N 1/04 |
| WO | WO-2022256295 A1 | * | 12/2022 | ........ G01N 33/0095 |
| WO | WO-2023089852 A1 | * | 5/2023 | .......... H01J 49/0481 |
| WO | WO-2023181882 A1 | * | 9/2023 | ........... G01N 27/623 |

* cited by examiner

METHOD FOR INSPECTING CHEMICAL SOLUTION, METHOD FOR PRODUCING CHEMICAL SOLUTION, METHOD FOR CONTROLLING CHEMICAL SOLUTION, METHOD FOR PRODUCING SEMICONDUCTOR DEVICE, METHOD FOR INSPECTING RESIST COMPOSITION, METHOD FOR PRODUCING RESIST COMPOSITION, METHOD FOR CONTROLLING RESIST COMPOSITION, AND METHOD FOR CHECKING CONTAMINATION STATUS OF SEMICONDUCTOR MANUFACTURING APPARATUS

CROSS-REFERENCE TO RELATED APPLICATIONS

The present application claims priority under 35 U.S.C. § 119 to Japanese Patent Application No. 2021-144874, filed on Sep. 6, 2021 and Japanese Patent Application No. 2022-133289, filed on Aug. 24, 2022. Each of the above applications is hereby expressly incorporated by reference, in its entirety, into the present application.

BACKGROUND OF THE INVENTION

1. Field of the Invention

The present invention relates to a method for inspecting a chemical solution, a method for producing a chemical solution, a method for controlling a chemical solution, a method for producing a semiconductor device, a method for inspecting a resist composition, a method for producing a resist composition, a method for controlling a resist composition, and a method for checking a contamination status of a semiconductor manufacturing apparatus, the methods using laser ablation inductively coupled plasma mass spectrometry (LA-ICP-MS).

2. Description of the Related Art

Currently, semiconductor substrates such as silicon substrates are used to produce various semiconductor devices. If there is a defect such as foreign matter on a surface of a semiconductor substrate, a defective semiconductor device may be produced due to insufficient formation of a gate of a transistor, breaking of a wire, or the like in the production of the semiconductor device. Such a defect such as foreign matter on a surface of a semiconductor substrate influences the yield of a semiconductor device.

Defects of a semiconductor substrate can be assessed, for example, using a method of assessing residual metal impurities inside silicon crystals of a silicon wafer described in JP2019-195020A. In the method of assessing residual metal impurities inside silicon crystals of a silicon wafer in JP2019-195020A, heat treatment is performed to gather metal impurities inside silicon crystals onto a silicon wafer surface, and vapor phase decomposition-inductively coupled plasma mass spectrometry (VPD-ICP-MS) is then performed to measure the concentration of the metal impurities gathered on the silicon wafer surface. The number of surface defects of the silicon wafer is measured using a SurfScan SP5 manufactured by KLA Corporation.

SUMMARY OF THE INVENTION

In the above-mentioned vapor phase decomposition-inductively coupled plasma mass spectrometry in JP2019-195020A, the silicon wafer is melted, and the defects of the semiconductor substrate cannot be assessed nondestructively. One method of nondestructively assessing defects of a semiconductor substrate is a method of assessing metallic contamination of a wafer in JP2020-027920A.

It is stated that in the method of assessing metallic contamination of a wafer in JP2020-027920A, a light-scattering type particle counter (e.g., SurfScan SP5 manufactured by KLA Corporation) that detects foreign matter by scanning a wafer surface with a laser beam and measuring the intensity of light scattering from the foreign matter and a confocal optical laser microscope (e.g., MAGICS manufactured by Lasertec Corporation) that detects foreign matter by detecting a difference in reflected light from the wafer surface are used as foreign matter inspection apparatuses. It is stated that a bright spot is observed under a scanning electron microscope (SEM) on the basis of coordinates acquired in a first step, and energy dispersive X-ray spectroscopy (EDX) analysis is performed on the basis of characteristic X-rays generated upon electron beam irradiation.

Here, as described above, when there is a defect such as foreign matter on a surface of a semiconductor substrate, the defect on the surface of the semiconductor substrate results in a defective semiconductor device to reduce the yield. This influence increases particularly as the semiconductor device becomes more miniaturized and more integrated. For this reason, it is important to measure defects on the surface of the semiconductor substrate, and it is more important to measure minute foreign matter among the defects on the semiconductor substrate. However, when the method of assessing metallic contamination of a wafer described in JP2020-027920A is used to analyze minute foreign matter measuring about 20 nm on a surface of a semiconductor substrate, it is highly likely that the analysis of elements cannot be made by EDX.

Similarly to the above-described semiconductor substrates, chemical solutions and resist compositions are also desired to be free of defects such as foreign matter from the viewpoint of, for example, quality control and production, and thus are desired to be measured for foreign matter, particularly, minute foreign matter, and the elemental analysis thereof is desired.

The control of minute foreign matter is desired also in semiconductor manufacturing apparatuses because the state of contamination influences, for example, the performance or quality of products to be produced. To control minute foreign matter in a semiconductor manufacturing apparatus, the measurement of the minute foreign matter, which causes, particularly, a highly miniaturized and highly integrated semiconductor device to be defective, and the elemental analysis thereof are desired.

An object of the present invention is to provide a method for inspecting a chemical solution, the method being able to analyze minute foreign matter in the chemical solution, a method for producing a chemical solution, a method for controlling a chemical solution, the method being able to control the quality of the chemical solution even when the amount of minute foreign matter contained in the chemical solution is very small, a method for producing a semiconductor device, a method for inspecting a resist composition, the method being able to analyze minute foreign matter in the resist composition, a method for producing a resist composition, a method for controlling a resist composition, the method being able to control the quality of the resist composition even when the amount of minute foreign matter contained in the resist composition is very small, a method for producing a semiconductor device, and a method for checking a contamination status of a semiconductor manufacturing apparatus, the method being able to control minute foreign matter in the semiconductor manufacturing apparatus.

To achieve the above object, one aspect of the present invention provides a method for inspecting a chemical solution, the method including a step 1X of preparing a chemical solution, a step 2X of applying the chemical solution onto a semiconductor substrate, and a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry.

Preferably, the method includes a step 4X of determining whether there is a metal element in the defect from mass spectrometry data of the defect obtained in the step 3X.

Preferably, the method includes, after the step 4X, a step 5X of measuring the number of defects containing the metal element.

Preferably, the method includes a step 5X of measuring the number of defects containing a metal element based on mass spectrometry data of the defect obtained in the step 3X.

Preferably, the chemical solution contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the chemical solution.

Preferably, the carrier gas has a water content of 0.00001 ppm by volume or more and 0.1 ppm by volume or less.

One aspect of the present invention provides a method for producing a chemical solution, the method including the method for inspecting a chemical solution.

One aspect of the present invention provides a method for controlling a chemical solution, the method including a step 1X of preparing a chemical solution; a step 2X of applying the chemical solution onto a semiconductor substrate; a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; a step 4X of determining whether there is a metal element in the defect from mass spectrometry data of the defect obtained in the step 3X and a step 5X of measuring the number of defects containing the metal element, or a step 5X of measuring the number of defects containing a metal element based on mass spectrometry data of the defect obtained in the step 3X; and a step 6X of determining whether the number of defects obtained in the step 5X is within an acceptable range.

Preferably, the chemical solution contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the chemical solution.

Preferably, the carrier gas has a water content of 0.00001 ppm by volume or more and 0.1 ppm by volume or less.

One aspect of the present invention provides a method for producing a semiconductor device, the method including a step 1X of preparing a chemical solution; a step 2X of applying the chemical solution onto a semiconductor substrate; a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; a step 4X of determining whether there is a metal element in the defect from mass spectrometry data of the defect obtained in the step 3X and a step 5X of measuring the number of defects containing the metal element, or a step 5X of measuring the number of defects containing a metal element based on mass spectrometry data of the defect obtained in the step 3X; a step 6X of determining whether the number of defects obtained in the step 5X is within an acceptable range; and a step 7X of producing a semiconductor device by using a chemical solution determined to be within the acceptable range in the step 6X.

Preferably, the chemical solution is a pre-wetting solution, a developing solution, a rinsing solution, or a cleaning solution.

Preferably, the chemical solution contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the chemical solution.

Preferably, the carrier gas has a water content of 0.00001 ppm by volume or more and 0.1 ppm by volume or less.

One aspect of the present invention provides a method for inspecting a resist composition, the method including a step 1Y of preparing a resist composition; a step 2Y of applying the resist composition onto a semiconductor substrate; and a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry.

Preferably, the method includes a step 4Y of determining whether there is a metal element in the defect from mass spectrometry data of the defect obtained in the step 3Y.

Preferably, the method includes, after the step 4Y, a step 5Y of measuring the number of defects containing the metal element.

Preferably, the method includes a step 5Y of measuring, based on mass spectrometry data of the defect obtained in the step 3Y, the number of defects containing a metal element.

Preferably, the resist composition contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the resist composition.

Preferably, the carrier gas has a water content of 0.00001 ppm by volume or more and 0.1 ppm by volume or less.

One aspect of the present invention provides a method for producing a resist composition, the method including the method for inspecting a resist composition.

One aspect of the present invention provides a method for controlling a resist composition, the method including a step 1Y of preparing a resist composition; a step 2Y of applying the resist composition onto a semiconductor substrate; a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry; a step 4Y of determining whether there is a metal element in the defect from mass spectrometry data of the defect obtained in the step 3Y and a step 5Y of measuring the number of defects containing the metal element, or a step 5Y of measuring the number of defects containing a metal element based on mass spectrometry data of the defect obtained in the step 3Y; and a step 6Y of determining whether the number of defects obtained in the step 5Y is within an acceptable range.

Preferably, the resist composition contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the resist composition.

Preferably, the carrier gas has a water content of 0.00001 ppm by volume or more and 0.1 ppm by volume or less.

One aspect of the present invention provides a method for producing a semiconductor device, the method including a step 1Y of preparing a resist composition; a step 2Y of applying the resist composition onto a semiconductor substrate; a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry; a step 4Y of determining whether there is a metal element in the defect from mass spectrometry data of the defect obtained in the step 3Y and a step 5Y of measuring the number of defects containing the metal element, or a step 5Y of measuring the number of defects containing a metal element based on mass spectrometry data of the defect obtained in the step 3Y; a step 6Y of determining whether the number of defects obtained in the step 5Y is within an acceptable range; and a step 7Y of producing a semiconductor device by using a resist composition determined to be within the acceptable range in the step 6Y.

Preferably, the resist composition contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the resist composition.

Preferably, the carrier gas has a water content of 0.00001 ppm by volume or more and 0.1 ppm by volume or less.

One aspect of the present invention provides a method for checking a contamination status of a semiconductor manufacturing apparatus, the method including a step 1Z of preparing a chemical solution; a step 2Z of cleaning a semiconductor manufacturing apparatus by using the chemical solution; step 3Z of applying the chemical solution after the cleaning in the step 2Z onto a semiconductor substrate; a step 4Z of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; and a step 5Z of determining whether there is a metal element in the defect from mass spectrometry data of the defect obtained in the step 4Z.

Preferably, the method includes a step 6Z of measuring the number of defects containing the metal element.

One aspect of the present invention provides a method for checking a contamination status of a semiconductor manufacturing apparatus, including a step 1Z of preparing a chemical solution; a step 2Z of cleaning a semiconductor manufacturing apparatus by using the chemical solution; a step 3Z of applying the chemical solution after the cleaning in the step 2Z onto a semiconductor substrate; a step 4Z of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; and a step 6Z of measuring the number of defects containing a metal element based on mass spectrometry data of the defect obtained in the step 4Z.

Preferably, the carrier gas has a water content of 0.00001 ppm by volume or more and 0.1 ppm by volume or less.

The present invention can provide a method for inspecting a chemical solution, the method being able to analyze minute foreign matter in the chemical solution, a method for producing a chemical solution, a method for controlling a chemical solution, the method being able to control the quality of the chemical solution even when the amount of minute foreign matter contained in the chemical solution is very small, a method for producing a semiconductor device, a method for inspecting a resist composition, the method being able to analyze minute foreign matter in the resist composition, a method for producing a resist composition, a method for controlling a resist composition, the method being able to control the quality of the resist composition even when the amount of minute foreign matter contained in the resist composition is very small, a method for producing a semiconductor device, and a method for checking a contamination status of a semiconductor manufacturing apparatus, the method being able to control minute foreign matter in the semiconductor manufacturing apparatus.

DESCRIPTION OF THE PREFERRED EMBODIMENTS

Hereinafter, a method for inspecting a chemical solution, a method for producing a chemical solution, a method for controlling a chemical solution, a method for producing a semiconductor device, a method for inspecting a resist composition, a method for producing a resist composition, a method for controlling a resist composition, and a method for checking a contamination status of a semiconductor manufacturing apparatus according to the present invention will be described in detail based on preferred embodiments illustrated in the attached drawings.

It should be noted that figures described below are illustrative of the present invention and are not intended to limit the present invention.

In the following, any numerical range expressed as ". . . to . . ." includes the values on both sides. For example, when $\varepsilon$ is from a value $\varepsilon_a$ to a value $\varepsilon_b$, the range of $\varepsilon$ is a range including the value $\varepsilon_a$ and the value $\varepsilon_b$, which is expressed by mathematical symbols as $\varepsilon_a \leq \varepsilon \leq \varepsilon_b$.

Angles such as "angles expressed by specific values", "parallel", "vertical", and "orthogonal" each include an error range generally acceptable in the corresponding technical field, unless otherwise specified.

The term "the same" includes an error range generally acceptable in the corresponding technical field. The terms such as "the entire surface" each include an error range generally acceptable in the corresponding technical field.

The term "prepare" is meant to include preparation by, for example, synthesis or formulation of specific materials and procurement of a desired object by, for example, purchase.

Furthermore, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

The chemical solution and the resist composition will be described later. Inductively coupled plasma mass spectrometry is performed as described later, and a specific equipment configuration for performing the inductively coupled plasma mass spectrometry will be described later.

The semiconductor manufacturing apparatus described later is not particularly limited, and examples of the semiconductor manufacturing apparatus include coater developers, spin coaters, semiconductor wafer cleaners, and developing devices.

Various chemical solutions used in the step of producing a semiconductor device, such as developing solutions, rinsing solutions, pre-wetting solutions, and peeling solutions, are required to be highly pure. Thus, it has become important to inspect and control such various chemical solutions, and it is desired to be able to analyze minute foreign matter in a chemical solution. Hereinafter, a method for inspecting a chemical solution and a method for controlling a chemical solution will be described.

Method for Inspecting Chemical Solution

Figure 1:
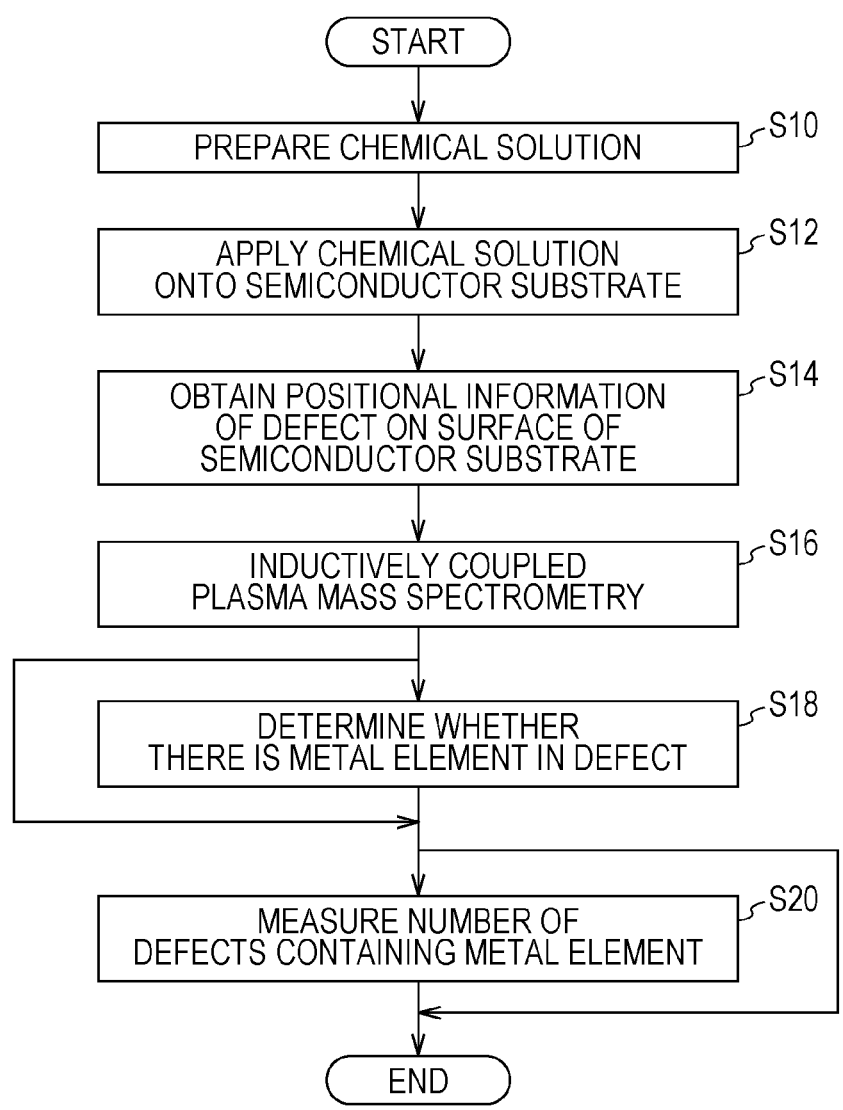
FIG. 1 is a flowchart showing an example of a method for inspecting a chemical solution according to an embodiment of the present invention.

FIG. 1 is a flowchart showing an example of a method for inspecting a chemical solution according to an embodiment of the present invention.

In the method for inspecting a chemical solution, a chemical solution to be inspected is first prepared (step 1X, Step S10).

Next, the chemical solution is applied onto a semiconductor substrate (not illustrated) (step 2X, Step S12).

For the application of the chemical solution to the semiconductor substrate, a coater developer is for example, but not necessarily, used.

For example, the semiconductor substrate may be, but not necessarily, a silicon substrate. The size of the semiconductor substrate is not particularly limited and is appropriately determined according to, for example, the specification of a coating device for applying the chemical solution to the semiconductor substrate, the specification of an apparatus used to perform inductively coupled plasma mass spectrometry, and the amount of the chemical solution to be measured.

Next, whether there is a defect on the surface of the semiconductor substrate is measured to obtain positional information of the defect on the surface of the semiconductor substrate (Step S14). Based on the positional information, the defect on the surface of the semiconductor substrate is irradiated with a laser beam, and an analytical sample obtained by the irradiation is collected by using a carrier gas and subjected to inductively coupled plasma mass spectrometry (step 3X, Step S16). Through the inductively coupled plasma mass spectrometry in Step S16 (step 3X), elements of the minute defect are identified. The size of the minute defect is also determined. Through the inductively coupled plasma mass spectrometry, mass spectrometry data of the defect of the chemical solution are obtained. The mass spectrometry data of the chemical solution include the information of the elements of the defect and the information of the size of the defect obtained through the inductively coupled plasma mass spectrometry. The chemical solution can be inspected in this manner, and the method for inspecting a chemical solution is able to analyze minute foreign matter in the chemical solution.

The above-described series of steps (step 3X, Steps S14 and S16) of performing inductively coupled plasma mass spectrometry after the application of the chemical solution to the semiconductor substrate will be described in detail later.

The method for inspecting a chemical solution preferably includes a step of measuring whether there is a defect on a surface of a semiconductor substrate to be used before the chemical solution is applied to the semiconductor substrate. In this case, the positional information and size of the defect are measured. This enables discrimination of measured defects between those derived from the semiconductor substrate and those derived from the chemical solution.

Through the inductively coupled plasma mass spectrometry (step 3X, Steps S14 and S16), elements of the minute defect can be identified, thus allowing measurement of the minute foreign matter and inspection of the chemical solution.

For the inductively coupled plasma mass spectrometry, the chemical solution is applied to the semiconductor substrate, and the minute foreign matter in the chemical solution can be analyzed. In the inductively coupled plasma mass spectrometry, the chemical solution may be present on the semiconductor substrate. Alternatively, a solvent contained in the chemical solution may be volatilized or evaporated after the chemical solution is applied to the semiconductor substrate, and the inductively coupled plasma mass spectrometry may be performed in a state where the solvent contained in the chemical solution is not present on the semiconductor substrate.

The method for inspecting a chemical solution may further include a step 4X (Step S18) of determining whether there is a metal element in the defect from the mass spectrometry data of the defect obtained in the step 3X. The chemical solution can be inspected based on whether there is a metal element.

The method may further include, after the step 4X (Step S18), a step 5X (Step S20) of measuring the number of defects containing the metal element. The chemical solution can be inspected by using the number of defects containing the metal element.

In the method for inspecting a chemical solution, elements of the defect have been identified through the inductively coupled plasma mass spectrometry (step 3X, Step S16). In Step S18, an attempt is made to select a metal element from the mass spectrometry data including the information of the identified elements of the defect. When no metal elements are selected from the mass spectrometry data, it is determined that there is no metal element. On the other hand, when a metal element is selected from the mass spectrometry data, it is determined that there is the metal element.

In Step S20, when it has been determined that there is a metal element in Step S18, the number of defects containing the metal element is measured. For example, the number of defects containing the metal element is measured by counting the number of defects containing the metal element.

Alternatively, the number of defects containing a metal element may be measured (step 5X, Step S20) based on the mass spectrometry data of the defect obtained in the step 3X (Step S16) without performing the step 4X (Step S18) of determining whether there is a metal element. In this case, in Step S20, a metal element is selected from the mass spectrometry data including the information of the identified elements of the defect, and the number of defects containing the metal element is measured by counting the number of the selected metal elements. Also through this process, the chemical solution can be inspected by using the number of defects containing the metal element.

Method for Producing Chemical Solution

The above-described method for inspecting a chemical solution can be utilized for a method for producing a chemical solution. The results of the inductively coupled plasma mass spectrometry are utilized in the method for producing a chemical solution.

For example, in the method for producing a chemical solution, a threshold value or an acceptable range of the number of chemical solution defects is set in advance. For a chemical solution produced, the number of chemical solution defects is measured by the above-described method for inspecting a chemical solution. The measured number of chemical solution defects and the threshold value or the acceptable range are compared with each other, and if the number of defects is not more than the threshold value or within the acceptable range, the chemical solution is judged as acceptable and used as a product. If the number of defects is more than the threshold value or beyond the acceptable range, the chemical solution is judged as unacceptable and not used as a product. The acceptable range of the number of chemical solution defects is, for example, $0.07/cm^2$ or less. The acceptable range of the number of chemical solution defects is preferably 0.0001 to $10/cm^2$, more preferably 0.0002 to $1/cm^2$, still more preferably 0.0005 to $0.5/cm^2$.

Method for Controlling Chemical Solution

Figure 2:
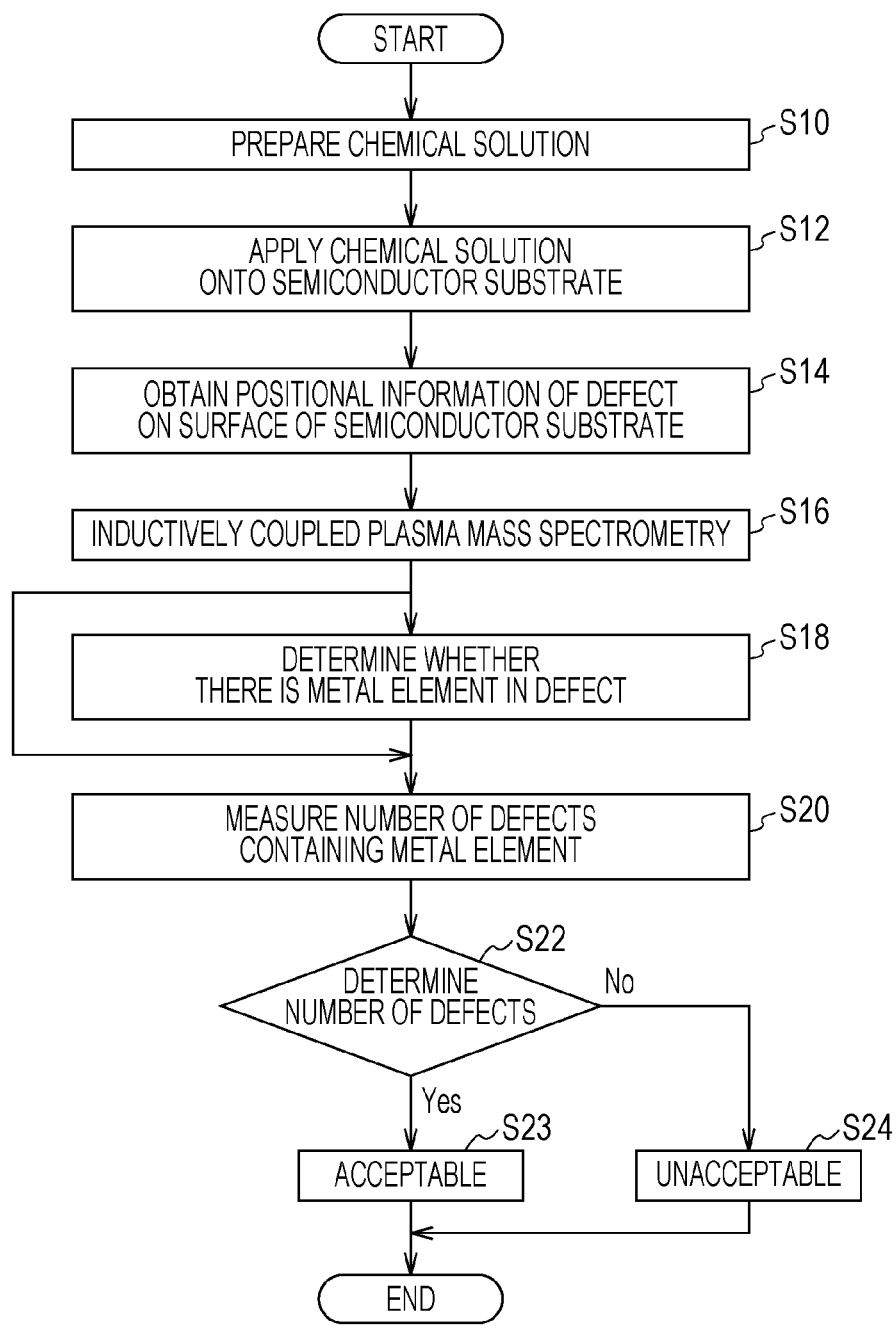
FIG. 2 is a flowchart showing an example of a method for controlling a chemical solution according to an embodiment of the present invention.

FIG. 2 is a flowchart showing an example of a method for controlling a chemical solution according to an embodiment of the present invention. In the method for controlling a chemical solution, the same steps as in the above-described method for inspecting a chemical solution will not be elaborated here.

As compared to the method for inspecting a chemical solution, the method for controlling a chemical solution shown in FIG. 2 includes the same steps as in the method for inspecting a chemical solution except for including preparing a chemical solution to be controlled (step 1X, Step S10) and including a step 6X (Step S22) of determining whether the number of defects obtained in the step 5X (Step S20) described above is within the acceptable range.

In the step of preparing a chemical solution (step 1X, Step S10), although there is a difference whether the chemical solution is to be inspected or to be controlled, the chemical solution is practically the same. Hence, the step 6X (Step S22) of determining whether the number of defects is within the acceptable range will be described.

In the method for controlling a chemical solution, a threshold value or an acceptable range of the number of chemical solution defects is set in advance. The threshold value of the number of chemical solution defects is set based on, for example, the number of chemical solution defects in the preceding production lot of a target chemical solution, but the threshold value may be any other value such as a target value, a set value, or an average value of a plurality of production lots. The acceptable range of the number of chemical solution defects is, for example, $0.07/cm^2$ or less. The acceptable range of the number of chemical solution defects is preferably 0.0001 to $10/cm^2$, more preferably 0.0002 to $1/cm^2$, still more preferably 0.0005 to $0.5/cm^2$.

In Step S22 (step 6X), the number of defects containing the metal element obtained in Step S20 described above and the threshold value or the acceptable range of the number of chemical solution defects are compared with each other. For example, if the measured number of chemical solution defects is not more than the threshold value or within the acceptable range, the chemical solution is judged as an acceptable product (Step S23). If the number of chemical solution defects is more than the threshold value or beyond the acceptable range, the chemical solution is judged as an unacceptable product (Step S24). In this manner, the quality of a chemical solution can be controlled by using the number of defects in the chemical solution. The method for controlling a chemical solution is able to control the quality of the chemical solution even when the amount of minute foreign matter contained in the chemical solution is very small.

First Example of Method for Producing Semiconductor Device

Figure 3:
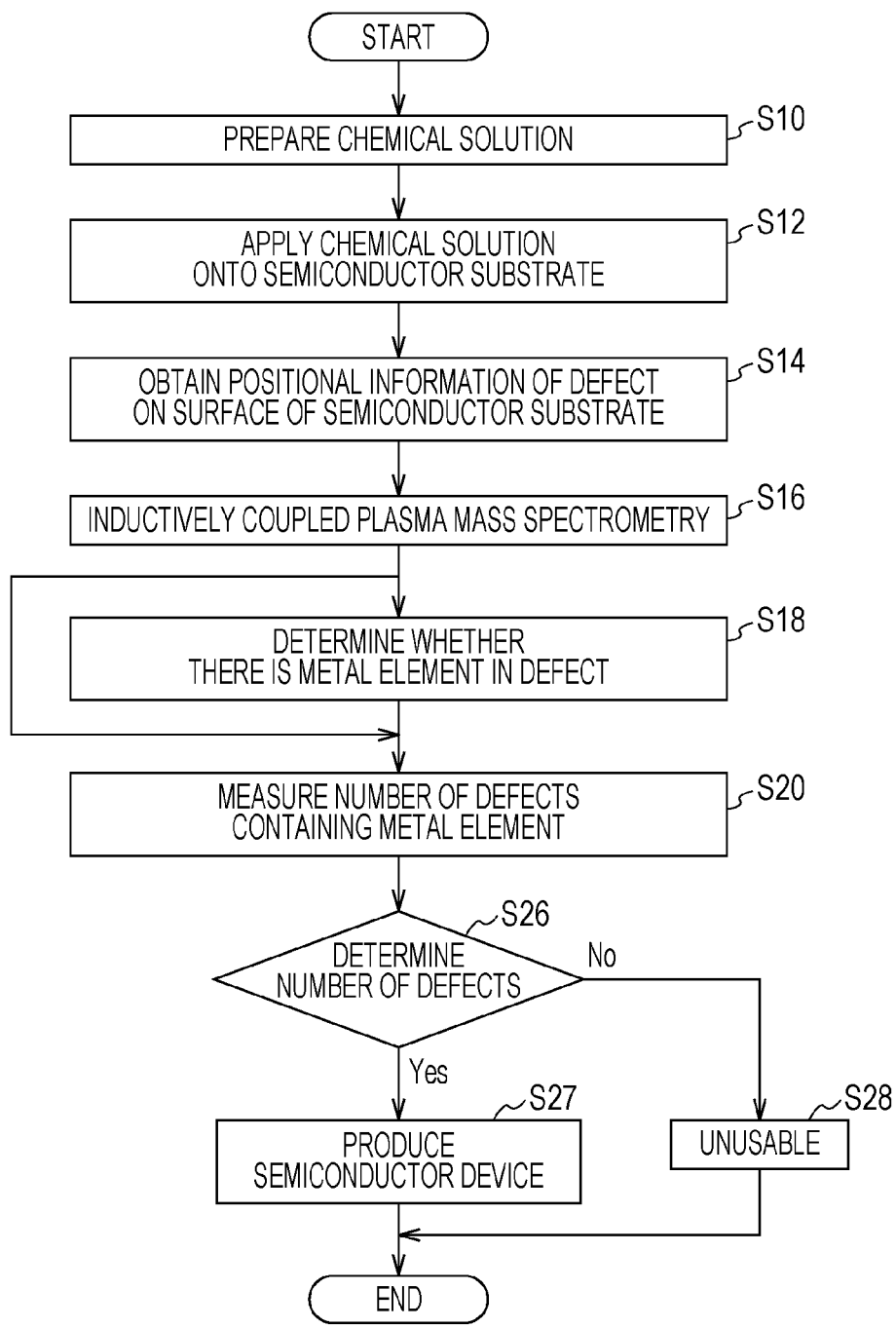
FIG. 3 is a flowchart showing a first example of a method for producing a semiconductor device according to an embodiment of the present invention.

FIG. 3 is a flowchart showing a first example of a method for producing a semiconductor device according to an embodiment of the present invention. In the first example of a method for producing a semiconductor device, the same steps as in the method for inspecting a chemical solution will not be elaborated here.

As compared to the method for inspecting a chemical solution, the first example of a method for producing a semiconductor device shown in FIG. 3 includes the same steps as in the method for inspecting a chemical solution except for including preparing a chemical solution used to produce a semiconductor device (step 1X, Step S10) and including a step 6X (Step S26) of determining whether the number of defects obtained in the step 5X (Step S20) described above is within an acceptable range and a step 7X (Step S27) of producing a semiconductor device by using a chemical solution determined to be within the acceptable range in the step 6X.

In the step of preparing a chemical solution (step 1X, Step S10), although there is a difference whether the chemical solution is to be inspected or used to produce a semiconductor device, the chemical solution is practically the same. Hence, the step 6X (Step S22) of determining whether the number of defects is within the acceptable range will be described.

In the method for producing a semiconductor device, a threshold value or an acceptable range of the number of chemical solution defects is set in advance. The threshold value or the acceptable range of the number of chemical solution defects is set based on, for example, the number of chemical solution defects in the preceding production lot of a target chemical solution, but the threshold value or the acceptable range may be any other value such as a target value, a set value, or an average value of a plurality of production lots. The acceptable range of the number of chemical solution defects is, for example, 0.07/cm$^2$ or less. The acceptable range of the number of chemical solution defects is preferably 0.0001 to 10/cm$^2$, more preferably 0.0002 to 1/cm$^2$, still more preferably 0.0005 to 0.5/cm$^2$.

In Step S26, the number of defects containing the metal element obtained in Step S20 described above and the threshold value or the acceptable range of the number of chemical solution defects are compared with each other. For example, if the measured number of chemical solution defects is not more than the threshold value or within the acceptable range, the chemical solution is used for the method for producing a semiconductor device (Step S27).

A chemical solution determined to have chemical solution defects more than the threshold value, that is, a chemical solution determined to have chemical solution defects beyond the acceptable range, in Step S26 (step 6X) is not used to produce a semiconductor device (Step S28). Thus, in the method for producing a semiconductor device, the selected chemical solution is used in the step of producing a semiconductor device, thereby producing a semiconductor device. The step of producing a semiconductor device depends on the type of chemical solution. For example, when the chemical solution is a developing solution, it is used for a lithography step.

In the method for producing a semiconductor device, the chemical solution is not particularly limited as long as it is related to the production of a semiconductor device, and is, for example, a pre-wetting solution, a developing solution, a rinsing solution, or a cleaning solution.

A resist composition used in the step of producing a semiconductor device is required to be free of defects such as foreign matter. Thus, it has become important to inspect and control a resist composition, and it is desired to be able to analyze minute foreign matter in a resist composition. Hereinafter, a method for inspecting a resist composition and a method for controlling a resist composition will be described.

Method for Inspecting Resist Composition

Figure 4:
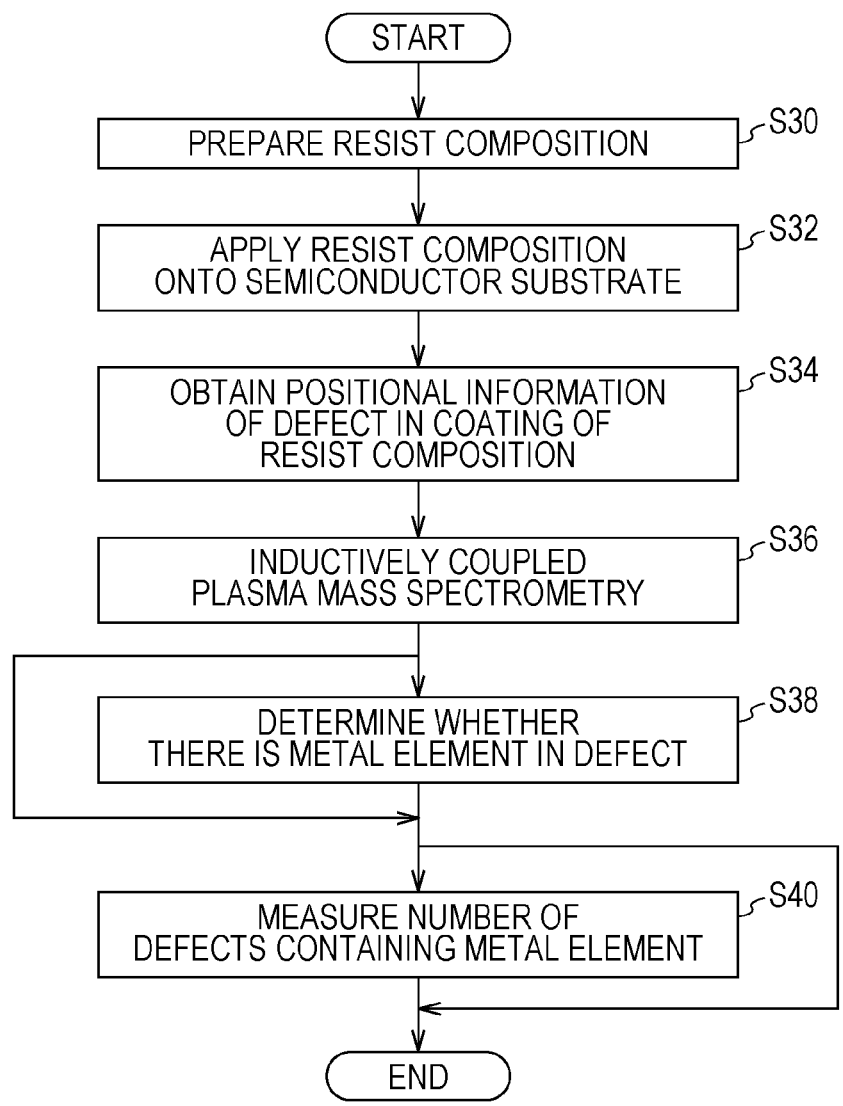
FIG. 4 is a flowchart showing an example of a method for inspecting a resist composition according to an embodiment of the present invention.

FIG. 4 is a flowchart showing an example of a method for inspecting a resist composition according to an embodiment of the present invention. As compared to the above-described method for inspecting a chemical solution, the method for inspecting a resist composition is different in that the target of inspection is a resist composition, and the other steps are basically the same as the steps in the method for inspecting a chemical solution.

In the method for inspecting a resist composition, a resist composition to be inspected is prepared (step 1Y, Step S30). Next, the resist composition is applied onto a semiconductor substrate (not illustrated) (step 2Y, Step S32). After the resist composition is applied onto the semiconductor substrate (not illustrated), a film is formed, and as a result, a coating of the resist composition is formed on the semiconductor substrate.

For the application of the resist composition to the semiconductor substrate, a coater developer is for example, but not necessarily, used.

The semiconductor substrate may be, but not necessarily, the semiconductor substrate used in the above-described method for inspecting a chemical solution. As in the above-described method for inspecting a chemical solution, the size of the semiconductor substrate is not particularly limited and is appropriately determined according to, for example, the specification of a coating device for applying the resist composition to the semiconductor substrate, the specification of an apparatus used to perform inductively coupled plasma mass spectrometry, and the amount of the resist composition to be measured.

Next, whether there is a defect in the coating of the resist composition is measured to obtain positional information of the defect in the coating of the resist composition on the semiconductor substrate (Step S34). Based on the positional information, the defect in the coating of the resist composition on the surface of the semiconductor substrate is irradiated with a laser beam, and an analytical sample obtained by the irradiation is collected by using a carrier gas and subjected to inductively coupled plasma mass spectrometry (step 3Y, Step S36). Through the inductively coupled plasma mass spectrometry in Step S36, elements of the minute defect are identified. The size of the minute defect is also determined. Through the inductively coupled plasma mass spectrometry, mass spectrometry data of the defect of the resist composition are obtained. The mass spectrometry data of the resist composition include the information of the elements of the defect and the information of the size of the defect obtained through the inductively coupled plasma mass spectrometry. The resist composition can be inspected in this manner. The method for inspecting a resist composition is able to analyze minute foreign matter in the resist composition.

The above-described series of steps (step 3Y, Steps S34 and S36) of performing inductively coupled plasma mass spectrometry after the application of the resist composition to the semiconductor substrate will be described in detail later.

The method for inspecting a resist composition preferably includes a step of measuring whether there is a defect on a surface of a semiconductor substrate to be used before the resist composition is applied to the semiconductor substrate. In this case, the positional information and size of the defect are measured. This enables discrimination of measured defects between those derived from the semiconductor substrate and those derived from the resist composition.

Through the inductively coupled plasma mass spectrometry (step 3Y, Steps S34 and S36), elements of the minute defect can be identified, thus allowing measurement of the minute foreign matter and inspection of the resist composition.

For the inductively coupled plasma mass spectrometry, the resist composition is applied to the semiconductor substrate, and the minute foreign matter in the resist composition can be analyzed. For example, the inductively coupled plasma mass spectrometry is performed in a state where the resist composition is in the form of a coating on the semiconductor substrate. A defect in the coating of the resist composition is measured. The defect in the coating of the resist composition is a defect derived from trace foreign matter unintendedly contained in the resist composition, and the defect in the coating of the resist composition means the same as the defect of the resist composition.

The method for inspecting a resist composition may further include a step 4Y (Step S38) of determining whether there is a metal element in the defect from the mass spectrometry data of the defect obtained in the step 3Y. The resist composition can be inspected based on whether there is a metal element.

The method may further include, after the step 4Y (Step S38), a step 5Y (Step S40) of measuring the number of defects containing the metal element. The resist composition can be inspected by using the number of defects containing the metal element.

In the method for inspecting a resist composition, elements of the defect have been identified through the inductively coupled plasma mass spectrometry (step 3Y, Step S36). In Step S38, an attempt is made to select a metal element from the mass spectrometry data including the information of the identified elements of the defect. When no metal elements are selected from the mass spectrometry data, it is determined that there is no metal element. On the other hand, when a metal element is selected from the mass spectrometry data, it is determined that there is the metal element.

In Step S40, when it has been determined that there is a metal element in Step S38, the number of defects containing the metal element is measured. For example, the number of defects containing the metal element is measured by counting the number of defects containing the metal element.

The number of defects containing a metal element may be measured (step 5Y, Step S40) based on the mass spectrometry data of the defect obtained in the step 3Y (Step S36) without performing the step 4Y (Step S38) of determining whether there is a metal element. In this case, in Step S40, a metal element is selected from the mass spectrometry data including the information of the identified elements of the defect, and the number of defects containing the metal element is measured by counting the number of the selected metal elements. Also through this process, the resist composition can be inspected by using the number of defects containing the metal element.

Method for Producing Resist Composition

The above-described method for inspecting a resist composition can be utilized for a method for producing a resist composition. The results of the inductively coupled plasma mass spectrometry are utilized in the method for producing a resist composition.

For example, in the method for producing a resist composition, a threshold value or an acceptable range of the number of resist composition defects is set in advance. For a resist composition produced, the number of resist composition defects is measured by the above-described method for inspecting a resist composition. The measured number of resist composition defects and the threshold value or the acceptable range are compared with each other, and if the number of defects is not more than the threshold value or within the acceptable range, the resist composition is judged as acceptable and used as a resist composition. If the number of defects is more than the threshold value or beyond the acceptable range, the resist composition is judged as unacceptable and not used as a resist composition. The acceptable range of the number of resist composition defects is, for example, 0.07/cm$^2$ or less. The acceptable range of the number of resist composition defects is preferably 0.0001 to 10/cm$^2$, more preferably 0.0005 to 5/cm$^2$, still more preferably 0.001 to 1/cm$^2$.

Method for Controlling Resist Composition

Figure 5:
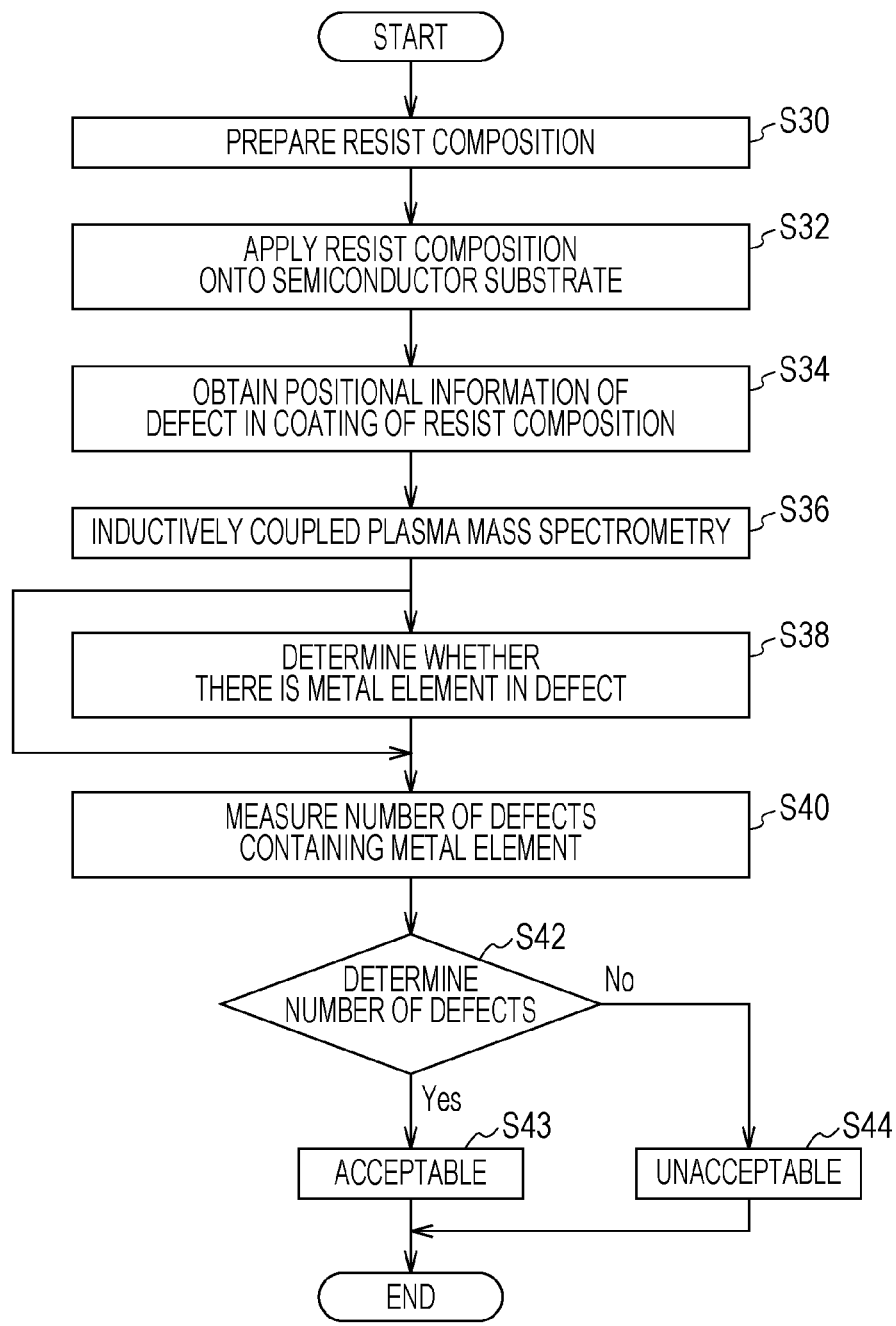
FIG. 5 is a flowchart showing an example of a method for controlling a resist composition according to an embodiment of the present invention.

FIG. 5 is a flowchart showing an example of a method for controlling a resist composition according to an embodiment of the present invention. As compared to the above-described method for controlling a chemical solution, the method for controlling a resist composition is different in that the target of inspection is a resist composition and includes the same steps as in the method for controlling a chemical solution.

As compared to the method for inspecting a resist composition, the method for controlling a resist composition shown in FIG. 5 includes the same steps as in the method for inspecting a resist composition except for including preparing a resist composition to be controlled (step 1Y, Step S30) and including a step 6Y (Step S42) of determining whether the number of defects obtained in the step 5Y (Step S40) described above is within the acceptable range.

In the step of preparing a resist composition (step 1Y, Step S30), although there is a difference whether the resist composition is to be inspected or to be controlled, the resist composition is practically the same. Hence, the step 6Y (Step S42) of determining whether the number of defects is within the acceptable range will be described.

In the method for controlling a resist composition, a threshold value or an acceptable range of the number of resist composition defects is set in advance. The threshold value of the number of resist composition defects is set based on, for example, the number of resist composition defects in the preceding production lot of a target resist composition, but the threshold value may be any other value such as a target value, a set value, or an average value of a plurality of production lots. The acceptable range of the number of resist composition defects is, for example, 0.07/$cm^2$ or less. The acceptable range of the number of resist composition defects is preferably 0.0001 to 10/$cm^2$, more preferably 0.0005 to 5/$cm^2$, still more preferably 0.001 to 1/$cm^2$.

In Step S42 (step 6Y), the number of defects containing the metal element obtained in Step S40 described above and the threshold value or the acceptable range of the number of resist composition defects are compared with each other. For example, if the measured number of resist composition defects is not more than the threshold value or within the acceptable range, the resist composition is judged as an acceptable product (Step S43). If the number of resist composition defects is more than the threshold value or beyond the acceptable range, the resist composition is judged as an unacceptable product (Step S44). In this manner, the quality of a resist composition can be controlled by using the number of defects in the resist composition.

Second Example of Method for Producing Semiconductor Device

Figure 6:
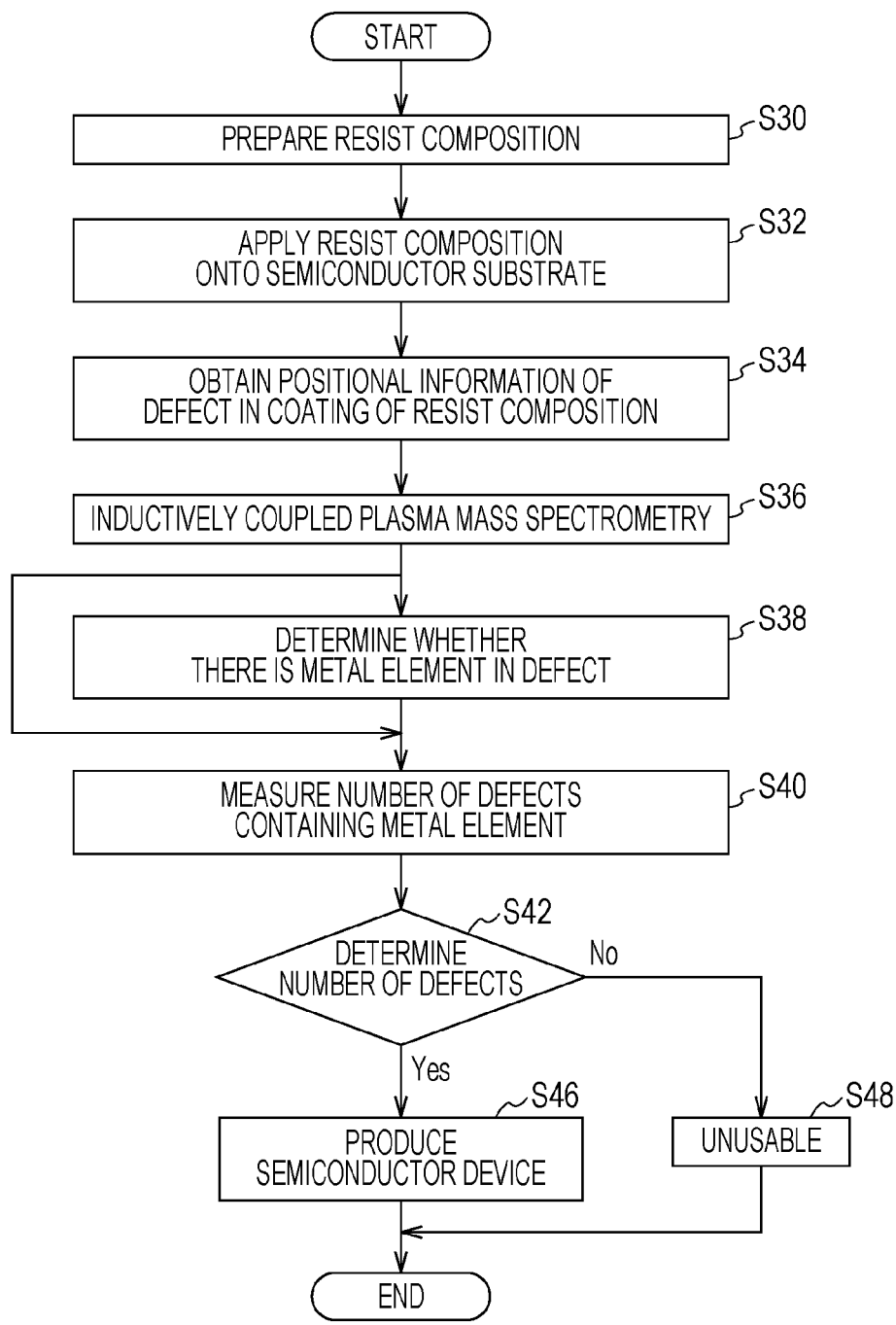
FIG. 6 is a flowchart showing a second example of a method for producing a semiconductor device according to an embodiment of the present invention.

FIG. 6 is a flowchart showing a second example of a method for producing a semiconductor device according to an embodiment of the present invention. In the second example of a method for producing a semiconductor device, the same steps as in the method for inspecting a resist composition will not be elaborated here. As compared to the first example of a method for producing a semiconductor device, the second example of a method for producing a semiconductor device is a production method that uses a resist composition in place of a chemical solution.

As compared to the method for inspecting a resist composition, the second example of a method for producing a semiconductor device shown in FIG. 6 includes the same steps as in the method for inspecting a resist composition except for including preparing a resist composition used to produce a semiconductor device (step 1Y, Step S30) and including a step 6Y (Step S42) of determining whether the number of defects obtained in the step 5Y (Step S40) described above is within an acceptable range and a step 7Y (Step S46) of producing a semiconductor device by using a resist composition determined to be within the acceptable range in the step 6Y.

In the step of preparing a resist composition (step 1Y, Step S30), although there is a difference whether the resist composition is to be inspected or used to produce a semiconductor device, the resist composition is practically the same. Hence, the step 6Y (Step S42) of determining whether the number of defects is within the acceptable range will be described.

In the method for producing a semiconductor device, a threshold value or an acceptable range of the number of resist compositions defects is set in advance. The threshold value or the acceptable range of the number of resist composition defects is set based on, for example, the number of resist composition defects in the preceding production lot of a target resist composition, but the threshold value or the acceptable range may be any other value such as a target value, a set value, or an average value of a plurality of production lots. The acceptable range of the number of resist composition defects is, for example, 0.07/$cm^2$ or less. The acceptable range of the number of resist composition defects is preferably 0.0001 to 10/$cm^2$, more preferably 0.0005 to 5/$cm^2$, still more preferably 0.001 to 1/$cm^2$.

In Step S42, the number of defects containing the metal element obtained in Step S40 described above and the threshold value or the acceptable range of the number of resist composition defects are compared with each other. For example, if the measured number of resist composition defects is not more than the threshold value or within the acceptable range, the resist composition is used for the method for producing a semiconductor device (Step S46).

A resist composition determined to have resist composition defects more than the threshold value, that is, determined to have resist composition defects beyond the acceptable range, in the step 6Y (Step S42) is not used to produce a semiconductor device (Step S48). Thus, in the method for producing a semiconductor device, the selected resist composition is used in the lithography step for producing a semiconductor device, thereby producing a semiconductor device.

Method for Checking Contamination Status of Semiconductor Manufacturing Apparatus The control of minute foreign matter is desired also in semiconductor manufacturing apparatuses because the state of contamination influences, for example, the performance or quality of products to be produced. To control minute foreign matter in a semiconductor manufacturing apparatus, the measurement of the minute foreign matter, which causes, particularly, a highly miniaturized and highly integrated semiconductor device to be defective, and the elemental analysis thereof are desired. Hereinafter, a method for checking a contamination status of a semiconductor manufacturing apparatus will be described.

Figure 7:
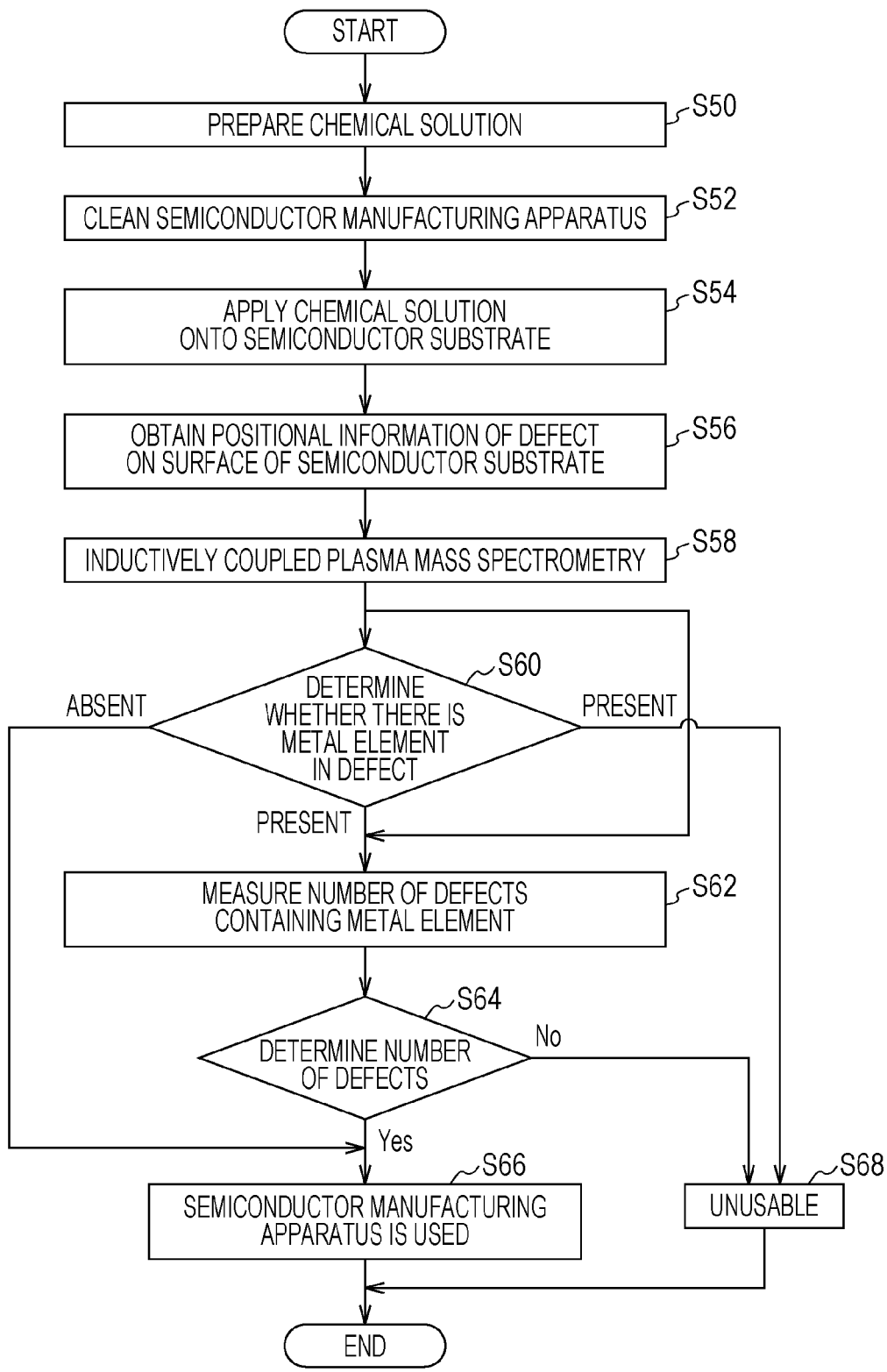
FIG. 7 is a flowchart showing an example of a method for checking a contamination status of a semiconductor manufacturing apparatus according to an embodiment of the present invention.

FIG. 7 is a flowchart showing an example of a method for checking a contamination status of a semiconductor manufacturing apparatus according to an embodiment of the present invention. In the method for checking a contamination status of a semiconductor manufacturing apparatus shown in FIG. 7, a chemical solution is first prepared (step 1Z, Step S50). The chemical solution is one used to clean a semiconductor manufacturing apparatus, and examples thereof include, but are not limited to, propylene glycol monomethyl ether acetate (PGMEA), propylene glycol monomethyl ether (PGME), isopropanol (IPA), butyl acetate (nBA), cyclohexanone (CHN), ethyl lactate (EL), methyl ethyl ketone (MEK), gamma-butyrolactone (GBL), 2-heptanone, and mixtures thereof in any desired ratios.

Next, a semiconductor manufacturing apparatus is cleaned using the chemical solution (step 2Z, Step S52). The chemical solution after the cleaning is recovered.

The method of cleaning the semiconductor manufacturing apparatus is not particularly limited, and examples include passing the chemical solution through pipes of the semiconductor apparatus and jetting the chemical solution into a container such as a chamber.

The chemical solution after the cleaning in the step 2Z (Step S52) is applied onto a semiconductor substrate (step 3Z, Step S54).

For the application of the chemical solution after the cleaning to the semiconductor substrate, a coater developer is for example, but not necessarily, used.

For example, the semiconductor substrate may be, but not necessarily, a silicon substrate. The size of the semiconductor substrate is not particularly limited and is appropriately determined according to, for example, the specification of a coating device for applying the chemical solution after the cleaning to the semiconductor substrate, the specification of an apparatus used to perform inductively coupled plasma mass spectrometry, and the amount of the chemical solution after the cleaning to be measured.

Next, whether there is a defect on the surface of the semiconductor substrate is measured to obtain positional information of the defect on the surface of the semiconductor substrate (Step S56). Based on the positional information, the defect on the surface of the semiconductor substrate is irradiated with a laser beam, and an analytical sample obtained by the irradiation is collected by using a carrier gas and subjected to inductively coupled plasma mass spectrometry (step 4Z, Step S58). Through the inductively coupled plasma mass spectrometry in Step S58, elements of the minute defect are identified. The size of the minute defect is also determined. In this manner, the contamination status of the semiconductor manufacturing apparatus can be checked.

The above-described series of steps (step 4Z, Steps S56 and S58) of performing inductively coupled plasma mass spectrometry after the application of the chemical solution after the cleaning to the semiconductor substrate will be described in detail later.

The method for checking a contamination status of a semiconductor manufacturing apparatus preferably includes a step of measuring whether there is a defect on a surface of a semiconductor substrate to be used before the chemical solution after the cleaning is applied to the semiconductor substrate. In this case, the positional information and size of the defect are measured. This enables discrimination of measured defects between those derived from the semiconductor substrate and those derived from the chemical solution after the cleaning.

Next, a step 5Z (Step S60) of determining whether there is a metal element in the defect from the mass spectrometry data of the defect obtained in the step 4Z (Step S58) is performed.

Elements of the defect have been identified through the inductively coupled plasma mass spectrometry (step 4Z, Step S58). In Step S58, an attempt is made to select a metal element from the mass spectrometry data including the information of the identified elements of the defect. When no metal elements are selected from the mass spectrometry data, it is determined that there is no metal element. On the other hand, when a metal element is selected from the mass spectrometry data, it is determined that there is the metal element.

When it is determined that there is no metal element in Step S60 (step 5Z), the contamination level of the semiconductor manufacturing apparatus is low, and the semiconductor manufacturing apparatus can be used (Step S66).

By contrast, when it is determined that there is a metal element, the state of contamination of the semiconductor manufacturing apparatus is bad, and the semiconductor manufacturing apparatus is determined to be unusable (Step S68). Through this process, the state of contamination of the semiconductor manufacturing apparatus can be determined by using the number of defects containing the metal element. As described above, the method for checking a contamination status of a semiconductor manufacturing apparatus is able to control minute foreign matter in the semiconductor manufacturing apparatus even when the amount of minute foreign matter contained in the chemical solution after the cleaning is very small.

When it is determined that there is a metal element, the number of defects containing the metal element can also be measured (step 6Z, Step S62). For example, the number of defects containing the metal element is measured by counting the number of defects containing the metal element.

The number of defects containing a metal element may be measured (step 6Z, Step S62) based on the mass spectrometry data of the defect obtained in the step 4Z (Step S58) without performing the step 5Z (Step S60) of determining whether there is a metal element. In this case, in Step S62, a metal element is selected from the mass spectrometry data including the information of the identified elements of the defect, and the number of defects containing the metal element is measured by counting the number of the selected metal elements. Also through this process, the state of contamination of the semiconductor manufacturing apparatus can be determined by using the number of defects containing the metal element.

In the method for checking a contamination status of a semiconductor manufacturing apparatus, for example, a threshold value or an acceptable range of the number of post-cleaning chemical solution defects is set in advance. The threshold value or the acceptable range of the number of post-cleaning chemical solution defects is appropriately determined according to the required cleanliness of the semiconductor manufacturing apparatus, and a target value or the like of the number of chemical solution defects is used. The acceptable range of the number of chemical solution defects is, for example, $0.07/cm^2$ or less. The acceptable range of the number of chemical solution defects is preferably $0.0001$ to $10/cm^2$, more preferably $0.0002$ to $1/cm^2$, still more preferably $0.0005$ to $0.5/cm^2$.

In Step S64, the number of defects containing the metal element obtained in Step S62 described above and the threshold value or the acceptable range of the number of post-cleaning chemical solution defects are compared with each other. For example, if the measured number of post-cleaning chemical solution defects is not more than the threshold value or within the acceptable range, the contamination level of the semiconductor manufacturing apparatus is low, and the semiconductor manufacturing apparatus is used (Step S66).

When it is determined in Step S64 that the number of chemical solution defects is more than the threshold value, that is, the number of chemical solution defects is beyond the acceptable range, the state of contamination of the semiconductor manufacturing apparatus is bad, and the semiconductor manufacturing apparatus is not used (Step S68).

When the semiconductor manufacturing apparatus is determined as unusable as described above, cleaning of the semiconductor manufacturing apparatus may be performed again. The semiconductor manufacturing apparatus may be repeatedly cleaned until the chemical solution after the cleaning is determined such that the semiconductor manufacturing apparatus is used (Step S66).

The method for checking a contamination status of a semiconductor manufacturing apparatus preferably includes a step of measuring whether there is a defect in a chemical solution before cleaning of the semiconductor manufacturing apparatus. In this case, the positional information and size of the defect are measured. This enables discrimination of defects of the chemical solution after the cleaning from those before the cleaning.

In the above description, the comparison and the determination are carried out, for example, in such a manner that various numerical values are entered into a computer, compared with a threshold value or the like, and determined based on the threshold value or the like. Thus, the comparison and the determination are performed, for example, by a computer.

To select a metal element from mass spectrometry data including the information of identified elements of a defect is to identify, by using a computer, a piece of information corresponding to a metal element stored in advance among pieces of information of elements in stored mass spectrometry data and select the identified piece of information as a metal element from the mass spectrometry data.

Hereinafter, a specific example of an analyzer will be described.

First Example of Analyzer

Figure 8:
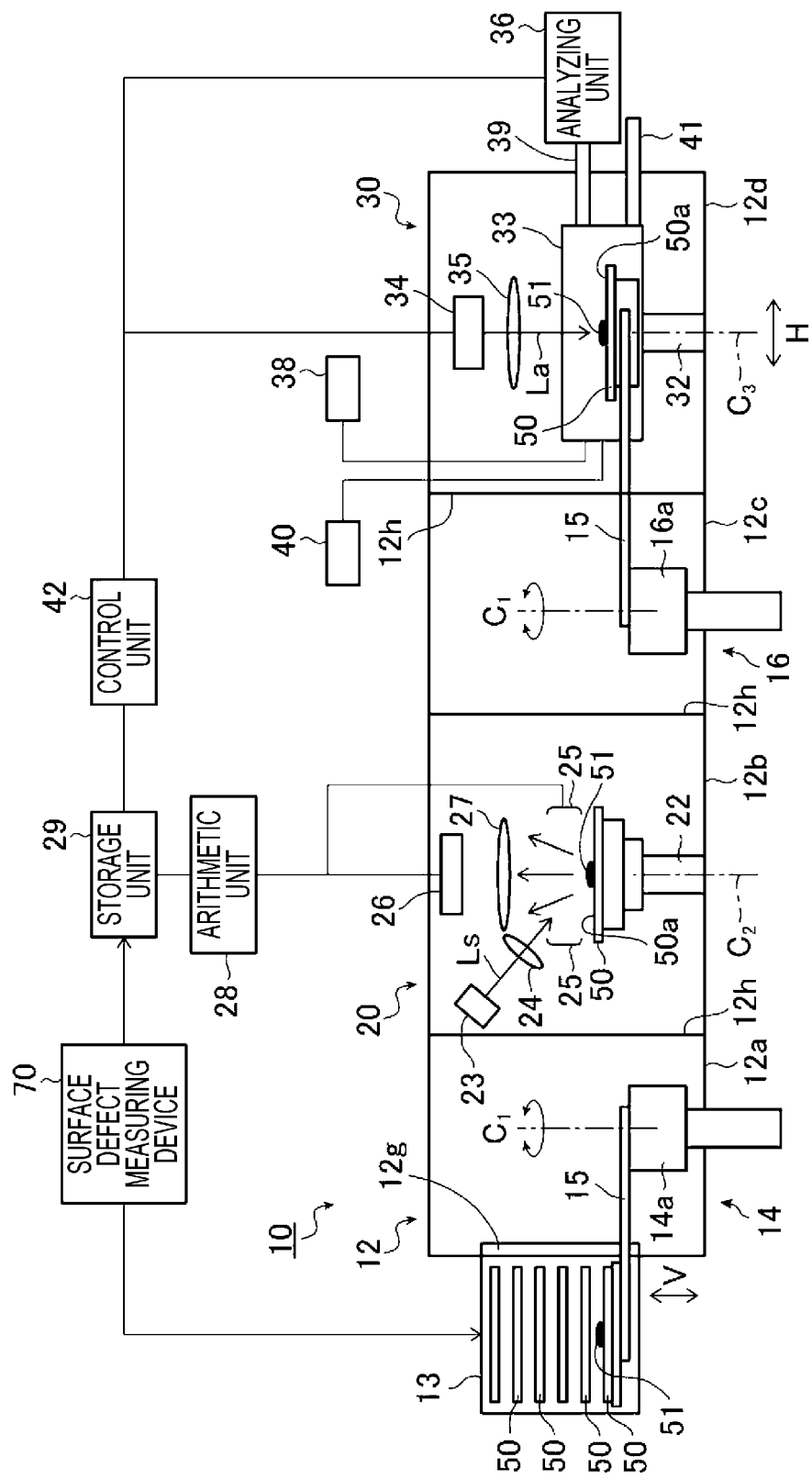
FIG. 8 is a schematic view showing a first example of an analyzer according to an embodiment of the present invention.
Figure 9:
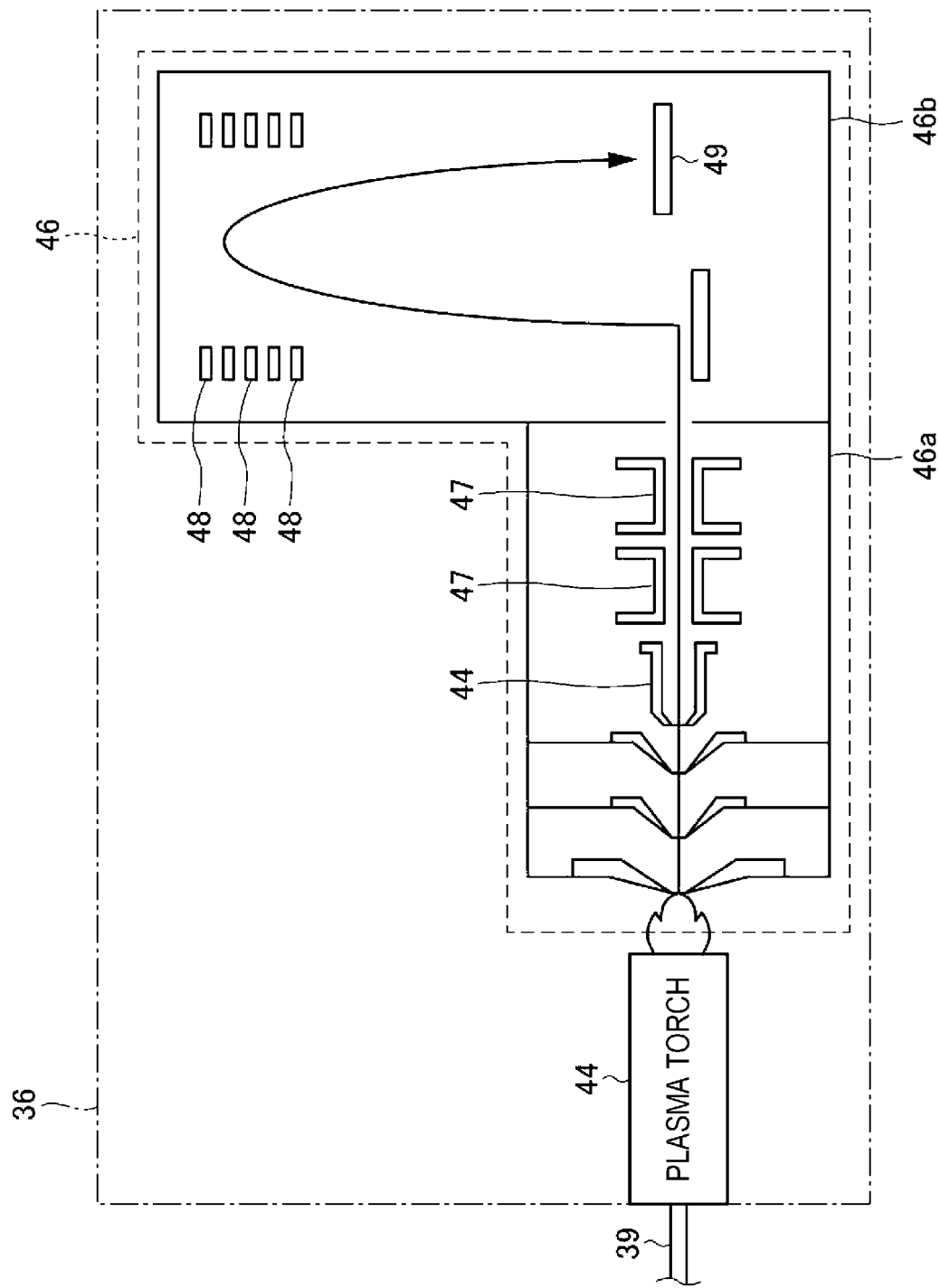
FIG. 9 is a schematic view showing an example of an analyzing unit of the first example of an analyzer according to an embodiment of the present invention.

FIG. 8 is a schematic view showing a first example of an analyzer according to an embodiment of the present invention, and FIG. 9 is a schematic view showing an example of an analyzing unit of the first example of an analyzer according to an embodiment of the present invention.

An analyzer 10 shown in FIG. 8 has a surface defect measuring unit 20 and an analysis unit 30, which will be described in detail later. The analyzer 10, whose measurement target is a semiconductor substrate 50, measures whether there is a defect on a surface of the semiconductor substrate and analyzes the defect on the surface of the semiconductor substrate.

In the inspection or the like of the above-described chemical solution or resist composition, the above-described chemical solution or resist composition is applied onto the semiconductor substrate 50. After the chemical solution is applied to the semiconductor substrate, a solvent contained in the chemical solution may be volatilized or evaporated so that the solvent contained in the chemical solution is not present on the semiconductor substrate. The resist composition, after being applied, forms a film and is in the form of a coating on the semiconductor substrate.

The analyzer 10 has a first transport chamber 12a, a measurement chamber 12b, a second transport chamber 12c, and an analysis chamber 12d, and the first transport chamber 12a, the measurement chamber 12b, the second transport chamber 12c, and the analysis chamber 12d are disposed in series in this order. The first transport chamber 12a, the measurement chamber 12b, the second transport chamber 12c, and the analysis chamber 12d are partitioned with walls 12h. Each wall is provided with a door (not illustrated) or the like so that the semiconductor substrate 50 to be measured can move from one chamber to another, and the door may be configured to open when the semiconductor substrate 50 is passed therethrough.

In the analyzer 10, the semiconductor substrate 50 is transported from outside the analyzer 10 to the first transport chamber 12a and is transported from the first transport chamber 12a to the measurement chamber 12b, and a surface defect of the semiconductor substrate 50 is measured in the measurement chamber 12b. Next, the semiconductor substrate 50 whose surface defect has been measured is transported from the measurement chamber 12b to the second transport chamber 12c and further transported to the analysis chamber 12d, and the analysis unit 30 analyzes the surface defect of the semiconductor substrate 50 on the basis of the results of the measurement of whether there is a defect on a surface 50a of the semiconductor substrate 50, the measurement being performed by the surface defect measuring unit 20.

In the analyzer 10, the atmosphere inside the first transport chamber 12a, the measurement chamber 12b, the second transport chamber 12c, and the analysis chamber 12d may be a specific atmosphere so that the semiconductor substrate 50 is not exposed to the outside air. For example, the gas inside the first transport chamber 12a, the measurement chamber 12b, the second transport chamber 12c, and the analysis chamber 12d may be evacuated by using a vacuum pump to create a reduced-pressure atmosphere.

Alternatively, an inert gas such as nitrogen gas may be fed inside the first transport chamber 12a, the measurement chamber 12b, the second transport chamber 12c, and the analysis chamber 12d to make the inside an inert gas atmosphere.

As described above, the first transport chamber 12a transports the semiconductor substrate 50 transported from outside the analyzer 10 to the measurement chamber 12b. The first transport chamber 12a is provided, on a side thereof, with an introduction unit 12g. A storage container 13 is mounted to the introduction unit 12g. The introduction unit 12g is provided with a seal member (not illustrated) to maintain the airtightness between the introduction unit 12g and the storage container 13.

The storage container 13, for example, contains therein a plurality of the semiconductor substrates 50 arranged in a shelf-like configuration. The semiconductor substrate 50 is, for example, a disk-shaped substrate.

The storage container 13 is, for example, a front opening unified pod (FOUP). By using the storage container 13, the semiconductor substrate 50 can be transported to the analyzer 10 in a sealed state without being exposed to the outside air. This can suppress contamination of the semiconductor substrate 50.

A transport device 14 is provided inside the first transport chamber 12a. The transport device 14 transports the semiconductor substrate 50 in the storage container 13 to the adjacent measurement chamber 12b via the first transport chamber 12a.

The transport device 14 is not particularly limited as long as it can take out the semiconductor substrate 50 from the storage container 13 and transport it onto a stage 22 in the measurement chamber 12b.

The transport device 14 shown in FIG. 8 has a transport arm 15 that clamps the outside of the semiconductor substrate 50 and a driving unit (not illustrated) that drives the transport arm 15. The transport arm 15 is attached to a mount 14a and rotatable about a rotational axis $C_1$. The transport arm 15 need not necessarily be configured to clamp the outside of the semiconductor substrate 50 as long as it can hold and transport the semiconductor substrate 50, and those used for transporting semiconductor wafers between processes can appropriately be used.

In the transport device 14, the mount 14a can move in a height direction V, and the transport arm 15 is movable in the height direction V, which is a direction parallel to the rotational axis $C_1$. According to the movement of the mount 14a in the height direction V, the position of the transport arm 15 in the height direction V can be changed.

Surface Defect Measuring Unit

In the measurement chamber 12b, a surface defect of the semiconductor substrate 50 is measured as described above. The surface defect measuring unit 20 is provided inside the measurement chamber 12b.

The surface defect measuring unit 20 measures whether there is a defect on the surface 50a of the semiconductor substrate 50 to obtain positional information of the defect on the surface 50a of the semiconductor substrate 50.

The surface defect measuring unit 20 has the stage 22 for placing the semiconductor substrate 50, a light casting unit 23 that casts incident light Ls on the surface 50a of the semiconductor substrate 50, and a condensing lens 24 that concentrates the incident light Ls onto the surface 50a of the semiconductor substrate 50.

The stage 22 for placing the semiconductor substrate 50 is rotatable about a rotational axis $C_2$ and can change the position of the semiconductor substrate 50 in the height direction V and a direction H orthogonal to the height direction V.

The stage 22 can change the position where the incident light Ls is incident on the surface 50a of the semiconductor substrate 50. This enables the incident light Ls to be sequentially incident on a specific area or the whole area of the surface 50a of the semiconductor substrate 50, so that a defect such as foreign matter on the surface 50a of the semiconductor substrate 50 can be detected.

Here, the foreign matter on the surface 50a of the semiconductor substrate 50 is derived from the above-described chemical solution or resist composition.

The wavelength of the incident light Ls cast by the light casting unit 23 is not particularly limited. The incident light Ls is, for example, ultraviolet light, and may be visible light or other light. Here, ultraviolet light refers to light in the wavelength range of less than 400 nm, and visible light refers to light in the wavelength range of 400 to 800 nm.

For the incidence angle of the incident light Ls, all directions parallel to the surface 50a of the semiconductor substrate 50 are assumed to be 0°, and the direction perpendicular to the surface 50a of the semiconductor substrate 50 to be 90°. At this time, when the incidence angle of the incident light Ls is defined in a range from a minimum of 0° to a maximum of 90°, the incidence angle of the incident light Ls is 0° or more and 90° or less, preferably more than 0° and less than 90°.

The surface defect measuring unit 20 has a light-receiving unit that receives radiation light radiated as a result of reflection or scattering of the incident light Ls on the surface 50a of the semiconductor substrate 50. The surface defect measuring unit 20 shown in FIG. 8 has, for example, two light-receiving units 25 and 26. When either the light-receiving unit 25 or 26 has received radiation light, it is determined that there is a defect on the surface 50a of the semiconductor substrate 50, and when no radiation light is generated, it is determined that there is no defect on the surface 50a of the semiconductor substrate 50. In this manner, whether there is a defect on the surface 50a of the semiconductor substrate 50 is measured.

The light-receiving unit 25 is disposed around the semiconductor substrate 50. The light-receiving unit 26 is disposed above the surface 50a of the semiconductor substrate 50. A condensing lens 27 is provided between the surface 50a of the semiconductor substrate 50 and the light-receiving unit 26. The condensing lens 27 concentrates radiation light generated by the incident light Ls on the light-receiving unit 26. The condensing lens 27 enables radiation light to be efficiently concentrated on the light-receiving unit 26. The number of light-receiving units need not necessarily be two. The surface defect measuring unit 20 may have either one of the light-receiving unit 25 and the light-receiving unit 26 or may have three or more light-receiving units.

The light-receiving unit 25 receives radiation light on the low-angle side. Light reception on the low-angle side means receiving light in the range of 0° or more and 80° or less at the above-described incidence angle.

The light-receiving unit 26 receives radiation light on the high-angle side. Light reception on the high-angle side means receiving light in the range of more than 80° and 90° or less at the above-described incidence angle.

The light-receiving unit 25 and the light-receiving unit 26 are constituted by, for example, a photosensor such as a photomultiplier.

Both the light-receiving unit 25 and the light-receiving unit 26 can receive unpolarized light or polarized light.

The surface defect measuring unit 20 has an arithmetic unit 28 and a storage unit 29.

The arithmetic unit 28 calculates the positional information of a detected defect and the size of the defect on the basis of the information of radiation light received by the light-receiving units 25 and 26. The positional information of a defect means the information of position coordinates of the defect on the surface 50a of the semiconductor substrate 50. The position coordinates are set, for example, as the origin of a preset reference position common to a plurality of the semiconductor substrates 50.

The radiation light radiated as a result of reflection or scattering of the incident light Ls cast by the light casting unit 23 due to the defect on the surface 50a of the semiconductor substrate 50 is received by the light-receiving units 25 and 26. The light-receiving units 25 and 26 detect the radiation light as a bright spot. The arithmetic unit 28 calculates, at the light-receiving units 25 and 26, the size of the defect that has caused the bright spot, that is, a detected size, from the size of the bright spot including the information of the radiation light due to the defect on the basis of the size of a standard particle. The calculation of the detected size based on the size of the standard particle is performed by using an arithmetic device included in a commercially available surface inspection system or by a known calculation method. The arithmetic unit 28 acquires, from a control unit 42, the positional information of the position where the incident light Ls is incident, and, for example, at the light-receiving units 25 and 26, the positional information of the defect on the surface 50a of the semiconductor substrate 50 and the information of the size of the defect are obtained based on the information of the radiation light due to the defect. The obtained positional information of the defect on the surface 50a of the semiconductor substrate 50 and the information of the size of the defect are stored in the storage unit 29.

The storage unit 29 is not particularly limited as long as it can store the positional information and size information of a defect such as foreign matter on the surface 50a of the semiconductor substrate 50, and, for example, any storage medium such as a volatile memory, a non-volatile memory, a hard disk, or a solid state drive (SSD) can be used.

Here, in the surface defect measuring unit 20, the control unit 42 controls the stage 22 and the light casting unit 23. The control unit 42 also controls the arithmetic unit 28.

The control unit 42 acquires the positional information of the incident light Ls cast by the light casting unit 23 on the surface 50a of the semiconductor substrate 50. The control unit 42 drives the stage 22 to change the irradiation position of the surface 50a of the semiconductor substrate 50 in order to cause the incident light Ls to be incident on an area on the surface 50a of the semiconductor substrate 50 that has not been irradiated with the incident light Ls.

In the surface defect measuring unit 20, the whole area of the surface 50a of the semiconductor substrate 50 is irradiated with the incident light Ls, and, for example, on the basis of the information of radiation light received by the two light-receiving units 25 and 26, the positional information of a defect on the surface 50a of the semiconductor substrate 50 at each irradiation position and the information of the size of the defect are obtained. In this manner, the positional information of a defect on the whole surface 50a of the semiconductor substrate 50 and the information of the size of the defect can be obtained. That is, the two-dimensional positional information of a defect on the surface 50a of the semiconductor substrate 50 and the information of the size of the defect can be obtained.

During the measurement by the surface defect measuring unit 20, the atmosphere in the measurement chamber 12*b* is not particularly limited and may be a reduced-pressure atmosphere or a nitrogen gas atmosphere as described above.

As the surface defect measuring unit 20, for example, a surface inspection system (SurfScan SP5; manufactured by KLA Corporation) can be used.

A transport device 16 is provided inside the second transport chamber 12*c*. The transport device 16 transports the semiconductor substrate 50 whose surface defect has been measured by the surface defect measuring unit 20 in the measurement chamber 12*b* from the measurement chamber 12*b* to the analysis chamber 12*d*.

The transport device 16 may have the same configuration as the transport device 14 described above. The transport device 16 has a transport arm 15 that clamps the outside of the semiconductor substrate 50 and a driving unit (not illustrated) that drives the transport arm 15. The transport arm 15 is attached to a mount 16*a* and rotatable about a rotational axis $C_1$.

In the transport device 16, the mount 16*a* can move in the height direction V and is movable in the height direction V, which is a direction parallel to the rotational axis $C_1$. The transport arm 15 can change its position in the height direction V as the mount 16*a* to which the transport arm 15 is attached moves in the height direction V.

Analysis Unit

The analysis unit 30 is provided inside the analysis chamber 12*d*. The analysis unit 30 performs analysis by using a laser ablation-inductively coupled plasma mass spectrometer (LA-ICP-MS).

An inductively coupled plasma mass spectrometer (ICP-MS) performs mass spectrometry by ionizing elements in a liquid sample by using plasma of argon gas at about 10,000° C. generated through inductive coupling. The LA-ICP-MS performs quantitative analysis of elements contained in an analytical sample in such a manner that a defect 51 on the surface 50*a* of the semiconductor substrate 50 is irradiated with a laser beam in a laser ablation unit (LA unit), and the analytical sample obtained by the irradiation is introduced into an ICP-MS unit (inductively coupled plasma mass spectrometry unit) by using a carrier gas.

The analysis unit 30 has a stage 32 for placing the semiconductor substrate 50 and a container 33 for housing the semiconductor substrate 50 placed on the stage 32.

An analyzing unit 36 is connected to the container 33 through a pipe 39. The semiconductor substrate 50 is analyzed in a state where the entire semiconductor substrate 50 is housed in the container 33. The stage 32 for placing the semiconductor substrate 50 is rotatable about a rotational axis $C_3$ and can change the position of the semiconductor substrate 50 in the height direction V and the direction H orthogonal to the height direction V.

The stage 32 is controlled by the control unit 42. The control unit 42 drives the stage 32 to change the irradiation position on the surface 50*a* of the semiconductor substrate 50 in order to irradiate the defect 51 on the surface 50*a* of the semiconductor substrate 50 with a laser beam La.

Here, if nothing is applied or formed on the surface 50*a* of the semiconductor substrate 50, the defect 51 on the surface 50*a* of the semiconductor substrate 50 is a defect 51 of the semiconductor substrate 50 itself and is a defect 51 derived from the semiconductor substrate 50. However, when a chemical solution or a resist composition is applied onto the semiconductor substrate 50 in the inspection or the like of the chemical solution or the resist composition as described above, the defect 51 is derived from the chemical solution or the resist composition.

The analysis unit 30 has a light source 34 for irradiating the defect 51 on the surface 50*a* of the semiconductor substrate 50 measured by the surface defect measuring unit 20 with the laser beam La. A condensing lens 35 that concentrates the laser beam La onto the defect 51 on the surface 50*a* of the semiconductor substrate 50 is provided between the light source 34 and the surface 50*a* of the semiconductor substrate 50.

The light source 34 and the condensing lens 35 are provided outside the container 33. The container 33 is provided with a window (not illustrated) that can transmit the laser beam La to allow the laser beam La to enter inside.

As the light source 34, a femtosecond laser, a nanosecond laser, a picosecond laser, an attosecond laser, or the like is used. As the femtosecond laser, for example, Ti-sapphire laser can be used.

The analysis unit 30 has a carrier gas supply unit 38 that supplies a carrier gas into the container 33.

The carrier gas supply unit 38 has a gas supply source (not illustrated) such as a cylinder in which the carrier gas is stored, a regulator (pressure regulator) connected to the gas supply source, and a regulating valve (not illustrated) that controls the amount of carrier gas supplied. For example, the regulator and the regulating valve are connected through a tube, and the regulating valve and the container 33 are connected through a pipe. As the carrier gas, for example, helium gas or argon gas is used.

Furthermore, the analysis unit 30 has a cleaning gas supply unit 40 that supplies a cleaning gas into the container 33. The cleaning gas supply unit 40 has a gas supply source (not illustrated) such as a cylinder in which the cleaning gas is stored, a regulator (pressure regulator) connected to the gas supply source, and a regulating valve (not illustrated) that controls the amount of cleaning gas supplied. For example, the regulator and the regulating valve are connected through a tube, and the regulating valve and the container 33 are connected through a pipe. As the cleaning gas, for example, helium gas or argon gas is used.

Furthermore, the container 33 is provided with an outlet 41 for flowing the cleaning gas out of the container 33. The outlet 41 is constituted by, for example, a pipe and a valve. By opening the valve, the cleaning gas can be flowed out of the container 33.

The container 33 may be provided with a heater (not illustrated) to perform flashing treatment. By heating the inside of the container 33 with the heater with the cleaning gas being supplied into the container 33, foreign matter such as ablated deposits, adsorbed gas, and the like in the container 33 are removed. This can increase the cleanliness in the container 33 to suppress contamination of the semiconductor substrate 50. As the heater, for example, an infrared lamp or a xenon flash lamp is used.

In addition to the cleaning gas, the carrier gas may also be used for the flashing treatment.

Analyzing Unit

The analyzing unit 36, which uses the ICP-MS described above, irradiates the defect 51 on the surface 50*a* of the semiconductor substrate 50 with the laser beam La, collects an analytical sample obtained by the irradiation by using a carrier gas, and subjects the analytical sample to inductively coupled plasma mass spectrometry. ICP is an abbreviation of inductively coupled plasma. In the analyzing unit 36, the measurement target is ionized with high-temperature plasma maintained by high-frequency electromagnetic induction, and the ions are detected with a mass spectrometer to thereby measure atom species and the concentration of the atom species detected.

As shown in FIG. 9, the analyzing unit 36 has, for example, a plasma torch 44 that generates plasma for ionizing the analytical sample introduced through the pipe 39 together with the carrier gas and a mass spectrometry unit 46 having an ion introduction section located in the vicinity of the tip portion of the plasma torch 44.

The plasma torch 44 has, for example, a triple tube structure, and the carrier gas is introduced through the pipe 39. A plasma gas for plasma formation is introduced into the plasma torch 44. As the plasma gas, for example, argon gas is used.

The plasma torch 44 is provided with a high-frequency coil (not illustrated) connected to a high-frequency power source (not illustrated), and by applying a high-frequency current at, for example, 27.12 MHz or 40.68 MHz and about 1 to 2 KW to the high-frequency coil, plasma is formed inside the plasma torch 44.

In the mass spectrometry unit 46, ions generated by the plasma torch 44 are introduced into an ion lens section 46a and a mass spectrometer section 46b through the ion introduction section. The interiors of the ion lens section 46a and the mass spectrometer section 46b are decompressed with a vacuum pump (not illustrated) such that the ion lens section 46a on the plasma torch 44 side is in low vacuum and the mass spectrometer section 46b is in high vacuum.

The ion lens section 46a is provided with a plurality of, for example, three, ion lenses 47. The ion lenses 47 separate ions to the mass spectrometer section 46b.

In the ion lens section 46a of the mass spectrometry unit 46, the above plasma light and ions are separated by the ion lenses 47, and only the ions are allowed to pass.

In the mass spectrometer section 46b, ions are separated according to their mass-to-charge ratio and detected by a detector 49. The mass spectrometer section 46b has a reflectron 48 that reflects, to the detector 49, ions that have passed through the ion lens section 46a and the detector 49 that detects the ions. The reflectron 48 is also called an ion mirror and is a device that reverses the direction of flight of charged particles by using an electrostatic field. By using the reflectron 48, charged particles having the same mass-to-charge ratio and different kinetic energies can be focused on the time axis so as to arrive at the detector 49 at substantially the same time. The reflectron 48 can compensate for errors and improve mass resolution. The reflectron 48 may be a known one used in a time-of-flight mass spectrometer (TOF-MS).

The detector 49 is not particularly limited as long as it can detect ions and identify elements, and may be a known one used in a time-of-flight mass spectrometer (TOF-MS).

The analyzing unit 36 enables, for example, a signal (not illustrated) of a detected element ion to be displayed as a chart by time (not illustrated). The concentration of a detected element corresponds to the signal strength.

As shown in FIG. 8, the analyzer 10 has the control unit 42, and on the basis of the positional information and size information of the above-described detected defect such as foreign matter on the surface 50a of the semiconductor substrate 50, the information being stored in the storage unit 29 of the surface defect measuring unit 20, the control unit 42 drives the stage 32 of the analysis unit 30 or changes the position where the laser beam La is incident to irradiate the defect 51 on the surface 50a of the semiconductor substrate 50 with the laser beam La. As a result, the defect 51 on the surface 50a of the semiconductor substrate 50 is analyzed.

The analyzer 10 is configured such that the analysis unit 30 can perform inductively coupled plasma mass spectrometry in a state where the entire semiconductor substrate 50 is housed in the container 33, which can suppress contamination of the surface 50a of the semiconductor substrate 50.

In the analyzer 10, the carrier gas and the cleaning gas are supplied through different channels, but any other system may be used. Since the timing of supply differs between the carrier gas and the cleaning gas, they may be supplied to the container 33 by sharing one arrangement. For example, only the carrier gas supply unit 38 may be provided without providing the cleaning gas supply unit 40.

The carrier gas preferably has a water content of 0.00001 ppm by volume or more and 0.1 ppm by volume or less.

When the water content of the carrier gas is 0.00001 ppm by volume or more and 0.1 ppm by volume or less, contamination of the surface 50a of the semiconductor substrate 50 during analysis in the container 33 can be reduced. For example, if the water content of the carrier gas is large, impurities may be dissolved in a trace amount of water adhering on the surface of the carrier gas pipe or the inner surface of the container 33, and the water may adhere again to the semiconductor substrate 50 to increase the number of defects. However, when the water content of the carrier gas is in the above range, these phenomena are suppressed.

If the water content is small, the surface 50a of the semiconductor substrate 50 tends to be charged when the carrier gas passes near the semiconductor substrate 50. As a result, charged particles floating in the container 33 tends to be drawn to the surface 50a of the semiconductor substrate 50, and particles floating around during transport by the transport system tends to be attracted to the surface 50a of the semiconductor substrate 50. In addition, re-adhesion of products resulting from laser ablation tends to occur, but when the water content of the carrier gas is in the above range, these phenomena are suppressed.

The amount of water contained in the carrier gas can be measured using an atmospheric pressure ionization mass spectrometer (API-MS) (e.g., manufactured by NIPPON API CO., LTD.).

The water content may be adjusted by any method, and can be adjusted by performing a gas purification step of removing water (water vapor) contained in the original gas. In particular, the amount of water contained in the carrier gas can be adjusted by adjusting the number of times of purification or the filter.

The flow rate of the carrier gas is preferably $1.69 \times 10^{-3}$ to $1.69$ Pa·m³/sec (1 to 1,000 sccm (standard cubic centimeter per minute)).

First Example of Analysis Method

An analysis method has a step of measuring whether there is a defect on a surface of a semiconductor substrate to obtain positional information of the defect on the surface of the semiconductor substrate; and a step of irradiating, based on the positional information of the defect on the semiconductor substrate, the defect on the surface of the semiconductor substrate with a laser beam, collecting an analytical sample obtained by the irradiation by using a carrier gas, and subjecting the analytical sample to inductively coupled plasma mass spectrometry. The analysis method will be specifically described.

Figure 10:
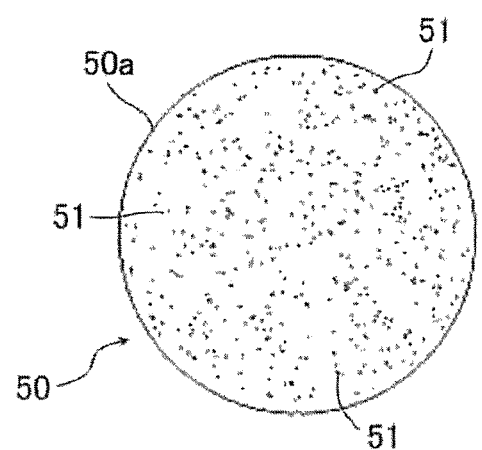
FIG. 10 is a schematic view illustrating a first example of an analysis method according to an embodiment of the present invention.
Figure 11:
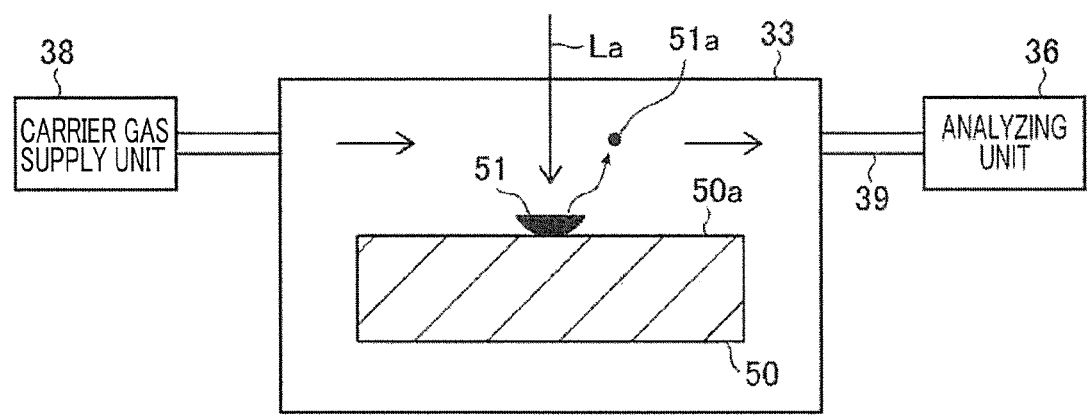
FIG. 11 is a schematic sectional view illustrating the first example of an analysis method according to an embodiment of the present invention.

FIG. 10 is a schematic view illustrating a first example of an analysis method according to an embodiment of the present invention, and FIG. 11 is a schematic sectional view illustrating the first example of an analysis method according to an embodiment of the present invention.

In FIG. 10 and FIG. 11, the same components as those of the analyzer 10 shown in FIG. 8 are denoted by the same reference numerals and will not be elaborated here.

In the analysis method, for example, the storage container 13 in which a plurality of the semiconductor substrates 50 are stored is connected to the introduction unit 12g on the side surface of the first transport chamber 12a of the analyzer 10 shown in FIG. 8. The lid of the storage container 13 is opened so that the semiconductor substrate 50 can be taken out of the storage container 13.

Next, the semiconductor substrate 50 is taken out of the storage container 13 by using the transport device 14 in the first transport chamber 12a, and the semiconductor substrate 50 is transported onto the stage 22 in the measurement chamber 12b. Due to this step of transporting the semiconductor substrate 50 from inside the storage container 13 onto the stage 22 in the measurement chamber 12b, contamination of the semiconductor substrate 50 is suppressed even if the semiconductor substrate 50 is transported from outside the analyzer 10. In the state where contamination of the semiconductor substrate 50 is suppressed, the surface defect of the semiconductor substrate 50 can be measured with the surface defect measuring unit 20.

Next, in the measurement chamber 12b, the surface defect measuring unit 20 measures the surface defect of the semiconductor substrate 50. As a result, the positional information and size of the defect such as foreign matter on the surface 50a of the semiconductor substrate 50 are detected. For example, the defect 51 can be shown on the surface 50a of the semiconductor substrate 50 as shown in FIG. 10. Showing the defect 51 on the surface 50a of the semiconductor substrate 50 is referred to as mapping. The positional information and size information of the defect 51 on the surface 50a of the semiconductor substrate 50 are stored in the storage unit 29. The positional information and size information of the defect 51 on the surface 50a of the semiconductor substrate 50 are referred to as mapping information.

Next, the semiconductor substrate 50 whose surface defect has been measured is transported from the measurement chamber 12b to the analysis chamber 12d by the transport device 16 in the second transport chamber 12c shown in FIG. 8.

Next, in the analysis chamber 12d, the analysis unit 30 performs analysis on the basis of the positional information and size information of the defect 51 on the surface 50a of the semiconductor substrate 50, that is, the mapping information. As shown in FIG. 11, the analysis is performed in a state where the entire semiconductor substrate 50 is housed in the container 33 and where the carrier gas is supplied from the carrier gas supply unit 38 into the container 33. In the analysis, the position of the defect 51 is specified based on the mapping information, and the semiconductor substrate 50 is moved to a position where the defect 51 will be irradiated with the laser beam La by using, for example, the stage 32.

Next, as shown in FIG. 11, the defect 51 on the surface 50a of the semiconductor substrate 50 is irradiated with the laser beam La. An analytical sample 51a obtained by the irradiation of the defect 51 with the laser beam La is moved to the analyzing unit 36 by the carrier gas. The analytical sample 51a derived from the defect 51 and moved by the carrier gas is subjected to inductively coupled plasma mass spectrometry in the analyzing unit 36 to identify the elements of the defect 51. As a result, mass spectrometry data of the defect 51 are obtained.

The analysis method preferably has, before the analysis step, a step of cleaning the inside of the container 33 by using a cleaning gas. The cleaning step is, specifically, a step of supplying the cleaning gas into the container 33 and heating the inside of the container 33 with a heater to perform flashing treatment before transporting the semiconductor substrate 50 into the container 33. As a result of the cleaning step, foreign matter such as ablated deposits, adsorbed gas, and the like in the container 33 are removed.

In the analyzer 10, positional information of the defect 51 on the surface 50a of the semiconductor substrate 50 obtained by measuring the defect 51 on the surface 50a of the semiconductor substrate 50 by using another apparatus different from the analyzer 10, for example, a surface defect measuring device 70 (see FIG. 8), can be used. The positional information of the defect 51 on the surface 50a of the semiconductor substrate 50 is, for example, mapping information as shown in FIG. 10. In this case, the mapping information acquired by the surface defect measuring device 70 is supplied to the storage unit 29. Furthermore, the semiconductor substrate 50 that has been subjected to measurement of the defect 51 on the surface 50a in the surface defect measuring device 70 is stored in, for example, the storage container 13 and transported to the analyzer 10. The semiconductor substrate 50 is transported to the analysis chamber 12d via the first transport chamber 12a, the measurement chamber 12b, and a second transport chamber 12c.

Next, the control unit 42 reads out the mapping information from the storage unit 29 and specifies the position of the defect 51 on the surface 50a of the semiconductor substrate 50 on the basis of the mapping information. Next, the semiconductor substrate 50 is moved to a position where the defect 51 will be irradiated with the laser beam La by using the stage 32. Next, the defect 51 on the surface 50a of the semiconductor substrate 50 is irradiated with the laser beam La. An analytical sample 51a obtained by the irradiation of the defect 51 with the laser beam La is moved to the analyzing unit 36 by the carrier gas. The analytical sample 51a derived from the defect 51 and moved by the carrier gas is subjected to inductively coupled plasma mass spectrometry in the analyzing unit 36 to identify the elements of the defect 51. As a result, mass spectrometry data of the defect 51 are obtained.

As described above, when the defect 51 is analyzed using the mapping information as shown in FIG. 10 measured by the surface defect measuring device 70 (see FIG. 8), the surface defect measuring unit 20 and the measurement of the surface defect of the semiconductor substrate 50 are not necessary. As a matter of course, the analyzer 10 need not be provided with the surface defect measuring device 70 shown in FIG. 8.

The positional information of the defect 51 on the surface 50a of the semiconductor substrate 50 supplied to the storage unit 29 need not necessarily be measured by the surface defect measuring device 70 (see FIG. 8). The surface defect measuring device 70 may have, for example, a storage unit (not illustrated) that stores the positional information. The surface defect measuring device 70 may have the same configuration as the surface defect measuring unit 20. Thus, the surface defect measuring device 70 has, for example, a light casting unit 23 that casts incident light Ls on the surface 50a of the semiconductor substrate 50 and a light-receiving unit 26 that receives radiation light radiated as a result of reflection or scattering of the incident light Ls due to the defect 51 on the surface 50a of the semiconductor substrate 50.

Second Example of Analyzer

Figure 12:
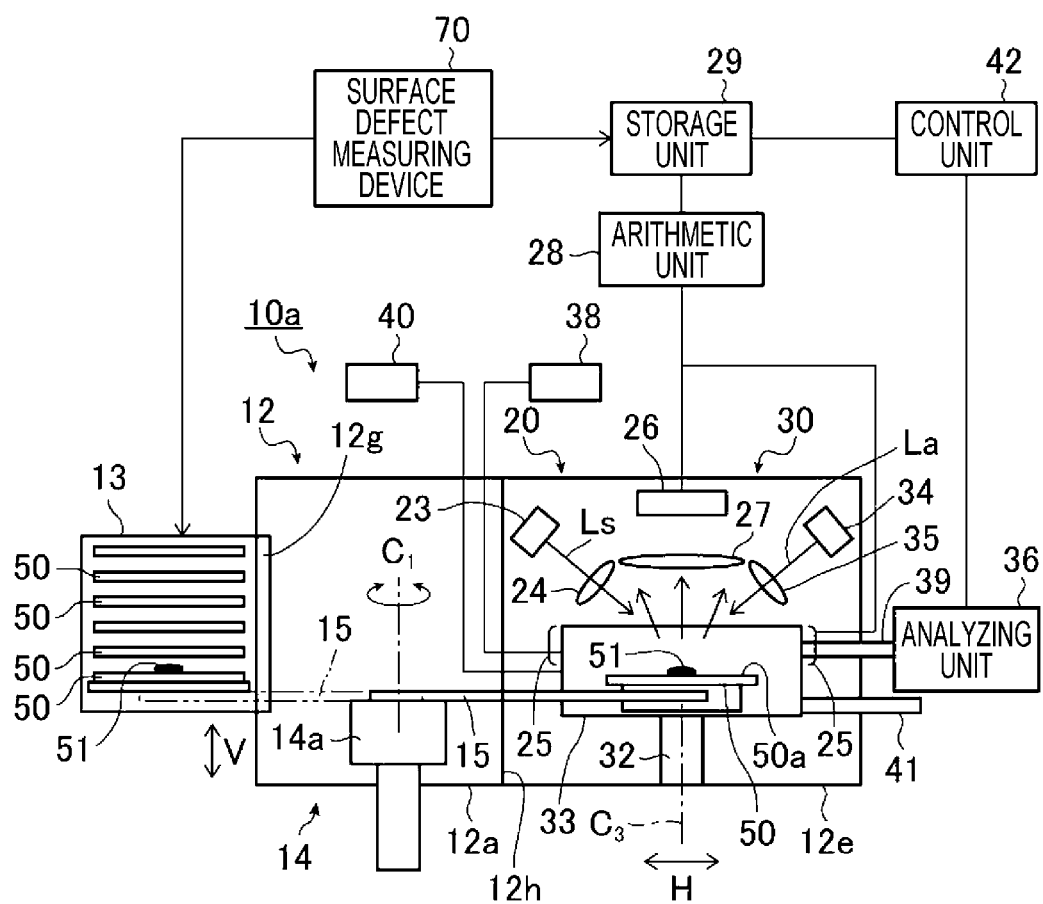
FIG. 12 is a schematic view showing a second example of an analyzer according to an embodiment of the present invention.

FIG. 12 is a schematic view showing a second example of an analyzer according to an embodiment of the present invention. In FIG. 12, the same components as those of the analyzer 10 shown in FIG. 8 are denoted by the same reference numerals and will not be elaborated here.

An analyzer 10a shown in FIG. 12 is different from the analyzer 10 shown in FIG. 8 in that the second transport chamber 12c and the transport device 16 are not provided and that the surface defect measuring unit 20 and the analysis unit 30 are provided in a single process chamber 12e, and the other configurations are the same as those of the analyzer 10 shown in FIG. 8.

In the analyzer 10a, surface defect measurement and analysis are performed in a state where the entire semiconductor substrate 50 is housed in the container 33.

In the analysis unit 30, the light source 34 is disposed such that the optical axis of the laser beam La is inclined with respect to the surface 50a of the semiconductor substrate 50.

The analyzer 10a can be more compact than the analyzer 10 shown in FIG. 8 by providing the surface defect measuring unit 20 and the analysis unit 30 in the single process chamber 12e.

In addition, due to the configuration in which the surface defect measurement by the surface defect measuring unit 20 and the inductively coupled plasma mass spectrometry by the analysis unit 30 can be performed in a state where the entire semiconductor substrate 50 is housed in the container 33, the number of times of transport of the semiconductor substrate 50 is reduced, and contamination of the surface 50a of the semiconductor substrate 50 can be further suppressed. As a result, the accuracy of measurement of the defect on the surface 50a of the semiconductor substrate 50 can be increased, and, furthermore, contamination in the process chamber 12e of the analyzer 10a can also be suppressed.

Second Example of Analysis Method

A second example of an analysis method is basically the same as the above-described first example of an analysis method. The second example of an analysis method is different from the above-described first example of an analysis method in that the surface defect measurement by the surface defect measuring unit 20 is performed in a state where the entire semiconductor substrate 50 is housed in the container 33 and that after the surface defect measurement, the semiconductor substrate 50 whose surface defect has been measured is not transported from the measurement chamber 12b to the analysis chamber 12d by the transport device 16, and the other steps are the same as the first example of an analysis method.

In the second example of an analysis method, by performing the surface defect measurement by the surface defect measuring unit 20 and the inductively coupled plasma mass spectrometry by the analysis unit 30 in a state where the entire semiconductor substrate 50 is housed in the container 33, contamination of the surface 50a of the semiconductor substrate 50 can be further suppressed, and contamination in the process chamber 12e of the analyzer 10a can be suppressed.

In addition, by performing the surface defect measurement by the surface defect measuring unit 20 and the inductively coupled plasma mass spectrometry by the analysis unit 30 in a state where the entire semiconductor substrate 50 is housed in the container 33 as described above, the transport of the semiconductor substrate 50 between steps is rendered unnecessary, and the analysis time can be shortened compared to the first example of an analysis method. Furthermore, contamination of the surface 50a of the semiconductor substrate 50 can be further suppressed as described above.

Also in the analyzer 10a, as in the analyzer 10, the mapping information as shown in FIG. 10 obtained by measuring the defect 51 on the surface 50a of the semiconductor substrate 50 by using another apparatus different from the analyzer 10, for example, a surface defect measuring device 70 (see FIG. 12), can be used. In this case, the mapping information acquired by the surface defect measuring device 70 is supplied to the storage unit 29. Furthermore, the semiconductor substrate 50 that has been subjected to measurement of the defect 51 on the surface 50a in the surface defect measuring device 70 is stored in, for example, the storage container 13 and transported to the analyzer 10a.

In the analyzer 10a, on the basis of the mapping information, the analysis unit 30 in the process chamber 12e performs inductively coupled plasma mass spectrometry on the analytical sample 51a derived from the defect 51 in the analyzing unit 36d as described above to identify the elements of the defect 51. As a result, mass spectrometry data of the defect 51 are obtained.

Also in this case, when the mapping information measured by the surface defect measuring device 70 (see FIG. 12) is used, the surface defect measuring unit 20 and measurement of the surface defect of the semiconductor substrate 50 are not necessary. As a matter of course, the analyzer 10a, as with the analyzer 10, need not be provided with the surface defect measuring device 70 shown in FIG. 12. The positional information of the defect 51 on the surface 50a of the semiconductor substrate 50 supplied to the storage unit 29 need not necessarily be measured by the surface defect measuring device 70 (see FIG. 12).

Third Example of Analyzer

As described above, when mapping information measured by an apparatus other than the analyzer, for example, the surface defect measuring device 70, is used, the surface defect measuring unit is not necessarily required in the analyzer, and the analyzer need not be provided with the surface defect measuring unit. In this case, the analyzer has the analysis unit 30 alone.

Figure 13:
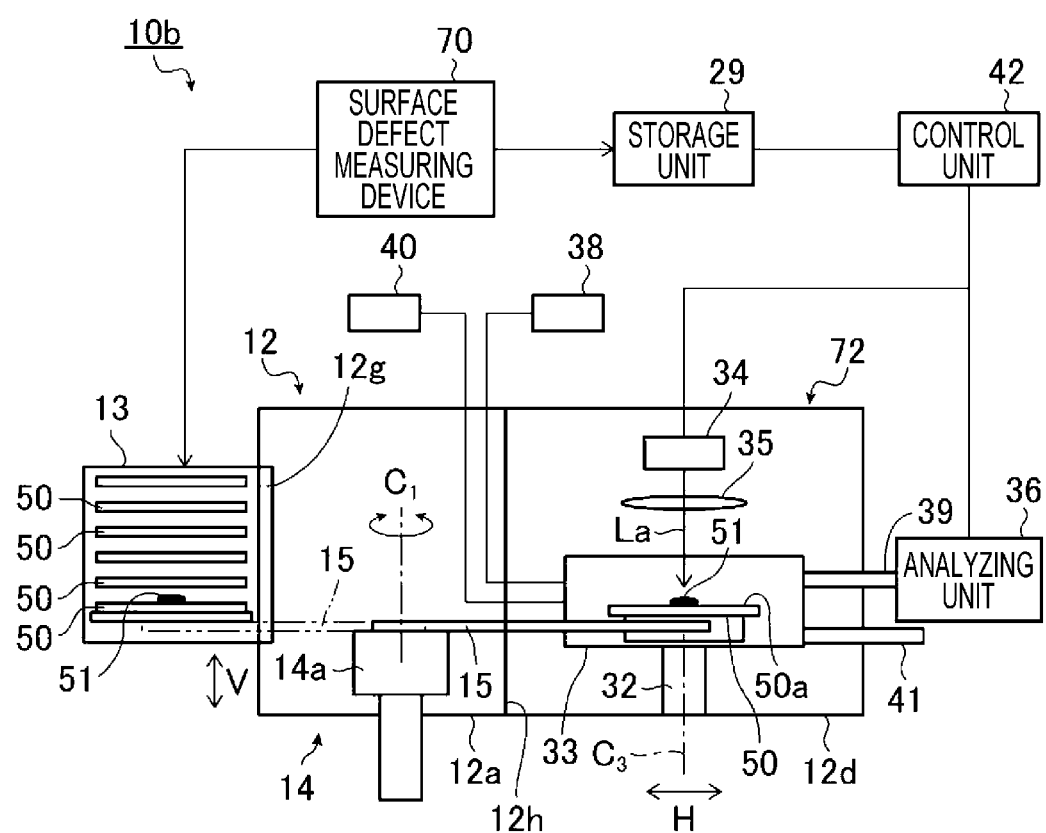
FIG. 13 is a schematic view showing a third example of an analyzer according to an embodiment of the present invention.

FIG. 13 is a schematic view showing a third example of an analyzer according to an embodiment of the present invention. In FIG. 13, the same components as those of the analyzer 10 shown in FIG. 8 and the analyzer 10a shown in FIG. 12 are denoted by the same reference numerals and will not be elaborated here.

An analyzer 10b shown in FIG. 13 is different from the analyzer 10 shown in FIG. 8 in that the first transport chamber 12a, the transport device 14, the measurement chamber 12b, the surface defect measuring unit 20, the second transport chamber 12c, and the transport device 16 are not provided. The analyzer 10b has the above-described surface defect measuring device 70 and a mass spectrometry device 72 corresponding to the analysis unit 30 (see FIG. 8). The mass spectrometry device 72 has the same configuration as the above-described analysis unit 30 (see FIG. 8), and thus the mass spectrometry device 72 will not be elaborated here.

In the analyzer 10b, the surface defect measuring device 70 and the mass spectrometry device 72 are separate devices and are not integrated. In this case, the mapping information acquired by the surface defect measuring device 70 is supplied to the storage unit 29. Furthermore, the semiconductor substrate 50 that has been subjected to measurement of the defect 51 on the surface 50a in the surface defect measuring device 70 is stored in, for example, the storage container 13 and transported to the mass spectrometry device 72. The semiconductor substrate 50 is transported to the analysis chamber 12d via the first transport chamber 12a.

Next, in the mass spectrometry device 72, the control unit 42 reads out the mapping information from the storage unit 29, and on the basis of the mapping information, the analyzing unit 36d performs inductively coupled plasma mass spectrometry on the analytical sample 51a derived from the defect 51 as described above in the analysis chamber 12d to identify the elements of the defect 51. As a result, mass spectrometry data of the defect 51 are obtained. The positional information of the defect 51 on the surface 50a of the semiconductor substrate 50 supplied to the storage unit 29 may be positional information other than that measured by the surface defect measuring device 70 (see FIG. 13).

Figure 14:
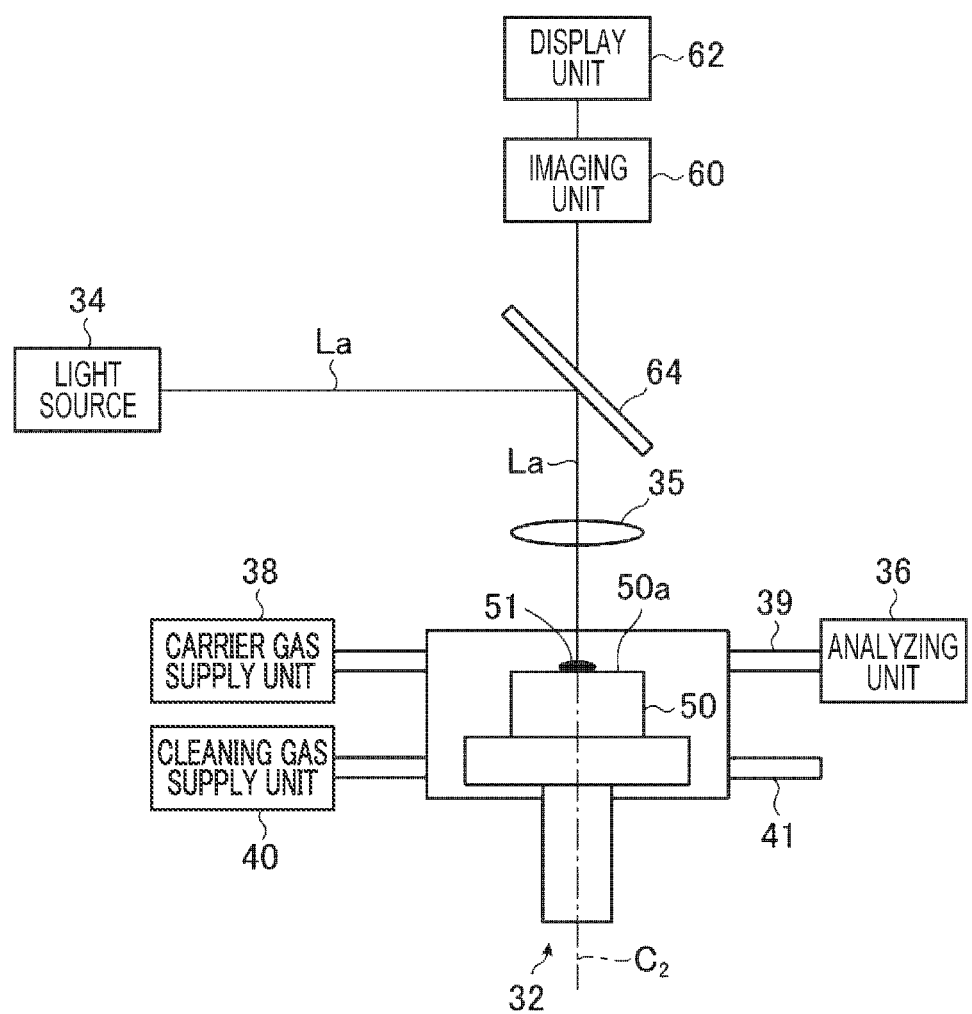
FIG. 14 a schematic view showing a modification of an analysis unit of an analyzer according to an embodiment of the present invention.

In any of the analyzer 10, the analyzer 10a, and the analyzer 10b described above, the configuration of the analysis unit 30 is not limited to those described above. Here, FIG. 14 is a schematic view showing a modification of an analysis unit of an analyzer according to an embodiment of the present invention. In FIG. 14, the same components as those of the analyzer 10 shown in FIG. 8 are denoted by the same reference numerals and will not be elaborated here.

The analysis unit 30 may be provided with an imaging unit 60 for observing the surface 50a of the semiconductor substrate 50 and a display unit 62 for displaying an image obtained in the imaging unit 60.

The imaging unit 60 allows the position where the laser beam La is incident on the surface 50a of the semiconductor substrate 50, that is, the position of the defect 51, to be observed. Examples of the imaging unit 60 include charge coupled device (CCD) sensors and complementary metal oxide semiconductor (CMOS) sensors. Examples of the display unit 62 include liquid crystal monitors and organic electro luminescence (EL) monitors.

The light source 34 and the imaging unit 60 are disposed, for example, with their optical axes (not illustrated) being orthogonal to each other. The imaging unit 60 is disposed so as to face the surface 50a of the semiconductor substrate 50.

A half mirror 64 is disposed where the optical axis of the light source 34 and the optical axis of the imaging unit 60 intersect. The laser beam La emitted from the light source 34 is reflected by the half mirror 64, passes through the condensing lens 35, and is incident on the surface 50a of the semiconductor substrate 50.

Semiconductor Substrate

The semiconductor substrate is not particularly limited, and any semiconductor substrate such as a silicon (Si) substrate, a sapphire substrate, a SiC substrate, a GaP substrate, a GaAs substrate, an InP substrate, or a GaN substrate can be used. As the semiconductor substrate, a silicon semiconductor substrate is often used.

Examples of the semiconductor device include the following.

Semiconductor Device

Examples of the semiconductor device include, but are not limited to, logic large scale integration (LSI) (e.g., application specific integrated circuits (ASICs), field programmable gate arrays (FPGAs), and application specific standard products (ASSPs)), microprocessors (e.g., central processing units (CPUs) and graphics processing units (GPUs)), memories (e.g., dynamic random access memories (DRAMs), hybrid memory cubes (HMCs), magnetic RAMs (MRAMs) and phase-change memories (PCMs), resistive RAMs (ReRAMs), ferroelectric RAMs (FeRAMs), and flash memories (NAND (Not AND) flash memories)), light emitting diodes (LEDs) (e.g., portable terminal microflashes, for on-board use, projector light sources, LCD backlights, and general illuminations), power devices, analog integrated circuits (ICs) (e.g., DC-DC converters and insulated-gate bipolar transistors (IGBTs)), micro electro mechanical systems (MEMS) (e.g., acceleration sensors, pressure sensors, oscillators, and gyrosensors), wireless devices (e.g., global positioning systems (GPS), frequency modulation (FM), nearfield communication (NFC), RF expansion modules (RFEMs), monolithic microwave integrated circuits (MMICs), and wireless local area networks (WLANs)), discrete elements, back side illuminations (BSIs), contact image sensors (CIS), camera modules, complementary metal oxide semiconductors (CMOS), passive devices, surface acoustic wave (SAW) filters, radio frequency (RF) filters, radio frequency integrated passive devices (RFIPDs), and broadband (BB).

The present invention is basically configured as described above. While the method for inspecting a chemical solution, the method for producing a chemical solution, the method for controlling a chemical solution, the method for producing a semiconductor device, the method for inspecting a resist composition, the method for producing a resist composition, the method for controlling a resist composition, and the method for checking a contamination status of a semiconductor manufacturing apparatus according to the present invention have been described above in detail, the present invention is not limited to the embodiments described above, and as a matter of course, various modifications or changes may be made without departing from the spirit of the present invention.

Chemical Solution

The chemical solution contains an organic solvent as the principal component.

As used herein, the term "organic solvent" refers to an organic compound in a liquid state contained in an amount exceeding 10,000 ppm by mass per component relative to the total mass of the above-described chemical solution. That is, in this specification, the organic compound in a liquid state contained in an amount exceeding 10,000 ppm by mass relative to the total mass of the above-described chemical solution corresponds to the organic solvent.

As used herein, the phrase "in a liquid state" means being liquid at 25° C. under atmospheric pressure.

The phrase "the organic solvent is the principal component in the chemical solution" means that the content of the organic solvent in the chemical solution is 98.0 mass % or more relative to the total mass of the chemical solution. The content of the organic solvent in the chemical solution is preferably more than 99.0 mass %, more preferably 99.90 mass % or more, still more preferably more than 99.95 mass %. The upper limit is less than 100 mass %.

One organic solvent may be used alone, or two or more organic solvents may be used. When two or more organic solvents are used, their total content is preferably within the above range.

The type of organic solvent is not particularly limited, and known organic solvents can be used. Examples of organic solvents include alkylene glycol monoalkyl ether carboxylates, alkylene glycol monoalkyl ethers, alkyl lactates, alkyl alkoxypropionates, cyclic lactones (preferably having 4 to 10 carbon atoms), monoketone compounds optionally having a ring (preferably having 4 to 10 carbon atoms), alkylene carbonates, alkyl alkoxyacetates, alkyl pyruvates, dialkyl sulfoxides, cyclic sulfones, dialkyl ethers, monohydric alcohols, glycols, alkyl acetates, and N-alkyl pyrrolidones.

The organic solvent is preferably at least one selected from the group consisting of, for example, propylene glycol monomethyl ether acetate (PGMEA), propylene glycol monomethyl ether (PGME), cyclohexanone (CHN), ethyl lactate (EL), propylene carbonate (PC), isopropanol (IPA), 4-methyl-2-pentanol (MIBC), butyl acetate (nBA), propylene glycol monoethyl ether, propylene glycol monopropyl ether, methyl methoxypropionate, cyclopentanone, γ-butyrolactone, diisoamyl ether, isoamyl acetate, dimethylsulfoxide, N-methylpyrrolidone, diethylene glycol, ethylene glycol, dipropylene glycol, propylene glycol, ethylene carbonate, sulfolane, cycloheptanone, and 2-heptanone.

Examples of the use of two or more organic solvents include combined use of PGMEA and PGME and combined use of PGMEA and PC.

The type and content of the organic solvent in the chemical solution can be determined using a gas chromatograph mass spectrometer.

The chemical solution may contain impurities in addition to the organic solvent.

Examples of the impurities include metal impurities.

The term "metal impurities" refers to metal impurities contained in the chemical solution in the form of metal ions and solids (e.g., elemental metals and particulate metal-containing compounds).

The type of metal element contained in the metal impurities is not particularly limited, and examples thereof include Na (sodium), K (potassium), Ca (calcium), Fe (iron), Cu (copper), Mg (magnesium), Mn (manganese), Li (lithium), Al (aluminum), Cr (chromium), Ni (nickel), Ti (titanium), and Zn (zirconium).

The metal impurities may be components inevitably contained in each component (ingredient) contained in the chemical solution, may be components inevitably contained during the production, storage, and/or transportation of the chemical solution, or may be intentionally added.

The chemical solution may contain water. The type of water is not particularly limited, and, for example, distilled water, ion-exchanged water, and pure water can be used.

Water may be added to the chemical solution or may be inevitably mixed into the chemical solution during the process of producing the chemical solution. Examples of cases where water is inevitably mixed during the process of producing the chemical solution include the case where water is contained in an ingredient (e.g., an organic solvent) used to produce the chemical solution and the case where water is mixed (e.g., contamination) during the process of producing the chemical solution.

The water content of the chemical solution is not particularly limited, and in general, it is preferably 2.0 mass % or less, more preferably 1.0 mass % or less, still more preferably less than 0.5 mass %, relative to the total mass of the chemical solution.

When the water content of the chemical solution is 1.0 mass % or less, the production yield of semiconductor chips improves.

The lower limit is not particularly limited, and is often about 0.01 mass %. In terms of production, it is difficult to reduce the water content to below this value.

Examples of methods of providing the above-described chemical solution include, but are not limited to, procuring an organic solvent by purchase or the like and reacting raw materials together to obtain an organic solvent. The chemical solution provided is preferably a chemical solution in which the content of the impurities already described is low (e.g., the content of the organic solvent is 99 mass % or more). Examples of commercially available products of such organic solvents include those which are called "high-purity grade products".

The chemical solution may optionally be subjected to purification treatment.

Examples of methods of purification include distillation and filtration.

Preferably, the chemical solution contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the chemical solution.

If the total content of the metal element is more than 10 ppb by mass, the coefficient of determination is small because no correlation can be established in terms of ppb by mass measured by means of a surface inspection system (SurfScan SP5; manufactured by KLA Corporation), ICP-MS, or the like.

The contents of Na, K, Ca, Fe, Cu, Mg, Mn, Li, Al, Cr, Ni, Ti, and Zn in the chemical solution can be measured by inductively coupled plasma mass spectrometry (ICP-MS) using a NexION 350 (trade name, manufactured by PerkinElmer). Specific conditions of measurement by ICP-MS are as follows. The detected amount is measured at a peak intensity with respect to a standard solution of known concentration and converted into the mass of metal components to determine the content of the metal components (total metal content) in the treatment liquid used for the measurement.

The content of the metal components is measured by standard ICP-MS. Specifically, software for ICP-MS is used as software used to analyze the metal components.

The measurement of 0.01 ppq by mass described above will be described.

First, 1 mL of the chemical solution is applied as a droplet onto a silicon wafer having a diameter of about 300 mm (12 inches). The chemical solution is then dried without rotation. After the position of a defect on the silicon wafer is determined with a surface inspection system (SurfScan SP7; manufactured by KLA Corporation), a section of and around the defect part is cut out with a FIB-SEM (HELIOS G4-EXL manufactured by Thermo Fisher Scientific, Inc.) on the basis of a coordinate file acquired by the surface inspection system (SurfScan SP7).

Under a focused ion beam scanning electron microscope (FIB-SEM) or a transmission electron microscope (TEM), three-dimensional shape information and element information are acquired by EDX while performing section etching. This procedure is performed for all defects.

For example, if one Fe spherical particle of 13.5 nm (the limit of the surface inspection system (SurfScan SP7)) is found when 1 mL (density: 1 g/cm$^3$) of the chemical solution is used, it is theoretically possible to measure approximately 0.01 ppq by mass in terms of mass ratio in theory.

Use of Chemical Solution

The chemical solution containing an organic solvent as the principal component is used in, for example, a method for producing a semiconductor device and a method for cleaning a semiconductor manufacturing apparatus. Specifically, the chemical solution is used as, for example, a developing solution, a rinsing solution, and a pre-wetting solution. In addition, the chemical solution is used as an edge rinsing solution, a back rinsing solution, a resist peeling solution, and a diluent thinner.

The pre-wetting solution, which is supplied onto a semiconductor substrate before a resist film is formed, is used to help spread a resist liquid over a semiconductor substrate and form a uniform resist film with a smaller amount of resist liquid supplied.

The edge rinsing solution mentioned above refers to a rinsing solution that is supplied to a peripheral portion of a semiconductor substrate and used to remove the resist film at the peripheral portion of the semiconductor substrate.

For example, butyl acetate (nBA) is used as the developing solution. Butyl acetate (nBA) can be used not only as the developing solution but also as, for example, a cleaning solution for pipes or a cleaning solution for semiconductor wafers.

As the rinsing solution, 4-methyl-2-pentanol (MIBC) is used. As the cleaning solution, propylene glycol monomethyl ether acetate (PGMEA) or isopropanol (IPA) is used. As the pre-wetting solution, cyclohexanone (CHN) is used.

Resist Composition

The type of the resist composition is not particularly limited, and a known resist composition can be used.

For example, as the resist composition, a resin (hereinafter also referred to simply as an "acid decomposable resin") having a group (hereinafter also referred to simply as an "acid decomposable group") that generates a polar group under the action of acid, a photoacid generator, or a resist composition (hereinafter also referred to as a "first resist composition") containing a solvent can be used.

The acid decomposable group preferably has a structure in which a polar group is protected by a leaving group that leaves under the action of acid. That is, the acid decomposable resin has a repeating unit having an acid decomposable group. The resin having such a repeating unit becomes more polar under the action of acid to experience an increase in solubility in alkaline developing solutions and a decrease in solubility in organic solvents.

The polar group is preferably an alkali-soluble group, and examples thereof include acidic groups such as a carboxyl group, a phenolic hydroxyl group, a fluorinated alcohol group, a sulfonic group, a phosphate group, a sulfonamide group, a sulfonylimide group, an (alkylsulfonyl)(alkylcarbonyl) methylene group, an (alkylsulfonyl)(alkylcarbonyl) imide group, a bis(alkylcarbonyl) methylene group, a bis (alkylcarbonyl) imide group, a bis(alkylsulfonyl) methylene group, a bis(alkylsulfonyl) imide group, a tris(alkylcarbonyl) methylene group, and a tris(alkylsulfonyl) methylene group, and alcoholic hydroxyl groups.

The acid decomposable resin may contain a repeating unit other than the repeating unit having an acid decomposable group (e.g., a repeating unit having an acid group, a repeating unit having a lactone group, a sultone group, or a carbonate group, or a repeating unit having a fluorine atom or an iodine atom).

As the acid decomposable resin, a known acid decomposable resin can be used.

The photoacid generator is not particularly limited as long as it is known, but is preferably a compound that generates at least one of an organic acid such as sulfonic acid, bis(alkylsulfonyl) imide, or tris(alkylsulfonyl) methide upon irradiation with actinic rays or radioactive rays, preferably electron rays or extreme ultraviolet rays.

Examples of the solvent include water and organic solvents. The type of the organic solvent is not particularly limited, and examples include alcohol solvents, ether solvents, ester solvents, ketone solvents, and hydrocarbon solvents.

The above first resist composition may contain materials other than the acid decomposable resin, the photoacid generator, and the solvent.

For example, the first resist composition may contain an acid diffusion control agent. Examples of the acid diffusion control agent include basic compounds and compounds that have proton-accepting functional groups and decompose upon irradiation with actinic rays or radioactive rays to generate compounds whose proton-accepting properties are reduced, lost, or changed to acidic properties.

The first resist composition may also contain a compound selected from the group consisting of hydrophobic resins, surfactants, dissolution-inhibiting compounds, dyes, plasticizers, photosensitizers, light absorbents, and compounds that promote solubility in developing solutions.

The resist composition may be a resist composition (hereinafter also referred to as a "second resist composition") containing a cross-linking agent having a cross-linking group, a compound having a reactive group that reacts with the cross-linking group, and a solvent.

The combination of the cross-linking group and the reactive group is not particularly limited, and a known combination is employed.

The cross-linking group or the reactive group may be protected by a protecting group. For example, the second resist composition may further contain a photoacid generator so that the protecting group is eliminated by an acid generated by the photoacid generator. Alternatively, a cross-linked structure may be formed as a result of a condensation reaction between the cross-linking agent and the resin caused by the acid generated by the photoacid generator.

While the second resist composition has been described in the context of containing two compounds: a cross-linking agent having a cross-linking group and a compound having a reactive group that reacts with the cross-linking group, one compound may contain a cross-linking group and a reactive group.

The resist composition may be a resist composition containing a main chain scission type polymer and a solvent.

When a polymer is of "main chain scission type", it means that the polymer has the property of undergoing scission of the main chain when irradiated with light such as ionizing radiation or ultraviolet light.

Examples of the main chain scission type polymer include acrylic main chain scission type resists such as polymethyl methacrylate (PMMA), ZEP (manufactured by Zeon Corporation), which is a copolymer of α-chloro methacrylate and α-methylstyrene, and poly-2,2,2-trifluoroethyl α-chloroacrylate (EBR-9, manufactured by Toray Industries, Inc.).

The resist composition may be what is called a metal resist composition.

Examples of the metal resist composition include photosensitive compositions that can form a coating including a metal oxo-hydroxo network having an organic ligand through a metal carbon bond and/or a metal carboxylate bond.

Examples of the metal resist composition include compositions disclosed in JP2019-113855A, the contents of which are incorporated herein by reference.

Preferably, the resist composition contains at least one metal element selected from the group consisting of Na, K, Ca, Fe, Cu, Mg, Mn, Li, Al, Cr, Ni, Ti, and Zn, and the total content of the metal element is 10 ppb by mass or less relative to the total mass of the resist composition.

EXAMPLES

The present invention will now be described in more detail with reference to examples. The materials, amounts, proportions, processes, process sequences, and others given in the following examples may be changed as appropriate without departing from the spirit of the present invention. Thus, the scope of the present invention should not be construed as being limited by the examples given below.

Example A

Production of Chemical Solution

First, a chemical solution (propylene glycol monomethyl ether acetate (PGMEA)) used in examples described later was prepared. Specifically, first, a high-purity grade organic solvent reagent having a purity of 99 mass % or more was purchased. The purchased reagent was then subjected to a filtration treatment using an appropriate combination of the following filters to prepare a chemical solution.

IEX-PTFE (15 nm): 15 nm IEX PTFE manufactured by Entegris, Inc.
PTEE (12 nm): 12 nm PTFE manufactured by Entegris, Inc.
UPE (3 nm): 3 nm PE filter manufactured by Entegris, Inc.

To adjust the amount of impurities in the chemical solution, the supplier or purity grade of the organic solvent reagent was changed, or a distillation treatment was performed before the filtration treatment, as appropriate. The conditions were adjusted so that Fe formed predominant nanoparticles on a silicon substrate.

Trace metals were measured in advance using an Agilent 8900 ICP-MS system manufactured by Agilent Technologies Ltd.

Hereinafter, Examples 1 to 13 and Comparative Examples 1 to 4 will be described. The results of Examples 1 to 13 and Comparative Examples 1 to 4 are shown in Table 1 below.

Examples 1 to 13

In Examples 1 to 13, the chemical solution was adjusted so that the number of particles on a silicon substrate having a diameter of 300 mm was as shown in the table. Using a coater developer, the adjusted chemical solution was applied onto the silicon substrate having a diameter of 300 mm.

The silicon substrate coated with the chemical solution was stored in a storage container capable of storing the entire silicon substrate and transported to a surface defect measuring unit.

As the surface defect measuring unit, a surface inspection system (SurfScan SP7; manufactured by KLA Corporation) was used. In the surface inspection system, by optical defect inspection, a laser beam was allowed to be incident on the surface of the silicon substrate, and scattered light was measured to determine the position and size of a defect on the silicon substrate. The obtained positional information and size information of the defect were stored in a storage unit.

Here, the silicon substrate used for the chemical solution application was measured in advance for defect positional information and size with the surface inspection system (SurfScan SP7), and the difference between the number of foreign bodies after the chemical solution application and the number of foreign bodies before the chemical solution application was calculated as foreign bodies derived from the chemical solution.

Next, the silicon substrate subjected to the surface defect measurement was transported to an analysis unit. As the analysis unit, a laser ablation ICP mass spectrometer (LA-ICP-MS) was used. In transporting the silicon substrate, the silicon substrate was loaded into a cell capable of housing the entire silicon substrate, and a carrier gas was allowed to flow into the cell.

On the basis of the obtained positional information and size information of the defect (klarf file), the elemental analysis of the defect by laser ablation was performed using the laser ablation ICP mass spectrometer, thus confirming that Fe was detectable at a predetermined position subjected to laser ablation.

The laser ablation was performed in a state where the silicon substrate was housed in the container and where the carrier gas was supplied. The analytical sample obtained by the laser ablation was collected using the carrier gas and subjected to inductively coupled plasma mass spectrometry. A femtosecond laser was used for the laser ablation.

Argon gas was used as the carrier gas. The flow rate of the carrier gas was $1.69 \times 10^{-2}$ Pa·m$^3$/sec (10 sccm). The water content of the carrier gas is shown in Table 1 below.

A front opening unified pod (FOUP) was used as the storage container for storing the semiconductor substrate.

Prior to the ablation, pre-cleaning was performed by flowing a cleaning gas into the cell at $1.69 \times 10^{-1}$ Pa·m$^3$/sec (100 sccm (standard cubic centimeter per minute)) for one minute.

Comparative Examples 1 to 4

In Comparative Examples 1 to 4, using the surface inspection system (SurfScan SP7; manufactured by KLA Corporation), a laser was allowed to be incident on the surface of the silicon substrate, and scattered light was measured to determine the position and size of a defect on the silicon substrate. The obtained positional information and size information of the defect were stored in a storage unit.

Next, in Comparative Examples 1 to 4, on the basis of the obtained positional information and size information of the defect, qualitative elemental analysis of the defect on the silicon substrate after being coated with the chemical solution was attempted using a defect review system (SEMVision G6 (manufactured by Applied Materials, Inc.)). The qualitative elemental analysis of the defect on the silicon substrate after being coated with the chemical solution in Comparative Examples 1 to 4 was performed using scanning electron microscope-energy dispersive X-ray spectroscopy (SEM-EDS). Since the SEM-EDS is performed under vacuum, no carrier gas is used. Thus, Comparative Examples 1 to 4 were marked with "-" in the column of "Water content of carrier gas" in Table 1 below.

In Examples 1 to 13 and Comparative Examples 1 to 4, defect positional information and size were measured using the surface inspection system (SurfScan SP7) after the chemical solution application. The results are shown in the column of "≤20 nm NP on substrate after chemical solution application (SP7)".

In Examples 1 to 13 and Comparative Examples 1 to 4, defect positional information and size were measured using the surface inspection system (SurfScan SP7) after the defect measurement of the chemical solution. The results are shown in the column of "≤20 nm NP on substrate after analysis (SP7)".

"Number of Fe detections in ≤20 nm NP" in Table 1 below shows the results of the defect measurement of the chemical solution in Examples 1 to 13 and Comparative Examples 1 to 4. In Table 1 below, nanoparticle is denoted as "NP".

volume or more and 0.1 ppm by volume or less, adhesion of nanoparticles due to contamination of the silicon substrate surface during the measurement was suppressed, thus suppressing contamination. Thus, the effectiveness of the present invention was confirmed.

Example B

Production of Chemical Solution

The same chemical solution as in Example A was used except that the kind of the chemical solution was different. The kinds of solutions provided were as follows: a wafer cleaning solution (propylene glycol monomethyl ether acetate (PGMEA)), a pre-wetting solution (cyclohexanone (CHN)), a developing solution (butyl acetate (nBA)), and a rinsing solution (4-methyl-2-pentanol (MIBC)).

For trace metals, each metal element was confirmed to be 10 ppb by mass or less.

Hereinafter, Examples 15 to 18 will be described. The results of Examples 15 to 18 are shown in Table 2 below.

Examples 15 to 18

In Examples 15 to 18, as in Examples 1 to 13 above, optical defect inspection was performed using a surface

TABLE 1

| Table 1 | ≤20 nm NP on substrate after chemical solution application (SP7) [number/substrate] Number of >20 nm NP in parentheses | Amount of Fe in chemical solution (ppb by mass) | Water content of carrier gas (ppm by volume) | Number of Fe detections in ≤20 nm NP [number/substrate] Number of >20 nm NP in parentheses | ≤20 nm NP on substrate after analysis (SP7) [number/substrate] Number of >20 nm NP in parentheses |
|---|---|---|---|---|---|
| Example 1 | 55(0) | 0.001 | 0.001 | 52(0) | 0(3) |
| Example 2 | 102(3) | 0.003 | 0.001 | 98(3) | 0(2) |
| Example 3 | 231(0) | 0.005 | 0.001 | 220(0) | 0(0) |
| Example 4 | 52(0) | 0.001 | 0.1 | 47(0) | 0(3) |
| Example 5 | 110(2) | 0.003 | 0.1 | 99(2) | 0(4) |
| Example 6 | 207(0) | 0.005 | 0.1 | 201(0) | 0(6) |
| Example 7 | 59(3) | 0.001 | 10 | 52(3) | 0(362) |
| Example 8 | 129(0) | 0.003 | 10 | 120(0) | 0(352) |
| Example 9 | 209(0) | 0.005 | 10 | 198(0) | 0(378) |
| Example 10 | 60(1) | 0.001 | 0.000005 | 58(0) | 0(362) |
| Example 11 | 103(2) | 0.003 | 0.000005 | 102(0) | 0(401) |
| Example 12 | 240(0) | 0.005 | 0.000005 | 238(0) | 0(299) |
| Comparative Example 1 | 52(0) | 0.001 | — | 1(0) | 52(0) |
| Comparative Example 2 | 98(0) | 0.003 | — | 0(0) | 98(0) |
| Comparative Example 3 | 221(3) | 0.005 | — | 3(0) | 221(3) |
| Example 13 | 403(1029) | 20 | 0.1 | 401(1011) | 0(4) |
| Comparative Example 4 | 488(1055) | 20 | — | 1(1015) | 488(1055) |

In Examples 1 to 13, Fe elements were detected even in fine nanoparticle defects of 20 nm or less, thus showing that fine metallic foreign bodies in a produced chemical solution can be inspected. In contrast, Fe elements of 20 nm or less were hardly detected in Comparative Examples 1 to 4.

In Examples 1 to 13, the results comparable to those obtained using the surface inspection system (SurfScan SP7) were obtained in the defect measurement.

In Examples 1 to 13, LA-ICP-MS was used. Thus, since the nanoparticles on the silicon substrate were ablated and disappeared as a result of the defect measurement, the nanoparticles were reduced after the defect measurement.

In Comparative Examples 1 to 4, SEM-EDX or SEM-EDS was used. Thus, the nanoparticles were not reduced after the defect measurement.

Furthermore, it was confirmed that by setting the water content of the carrier gas in the range of 0.00001 ppm by inspection system (SurfScan SP5; manufactured by KLA Corporation), and then inductively coupled plasma mass spectrometry was performed. The water content of the carrier gas was set to 0.1 ppm by volume.

Chemical Solution Control

The control allowable value regarding the number of metallic foreign bodies on a silicon substrate coated with a chemical solution was set as follows: the number of metallic foreign bodies of less than 20 nm is 150 or less per substrate.

Those satisfying the control allowable value are marked with "A" in the column of Allowability evaluation in Table 2 below, and those not satisfying the control allowable value are marked with "B" in the column of Allowability evaluation in Table 2 below. In Table 2 below, nanoparticle is denoted as "NP".

The control allowable value was determined by calculating the average +σ of the number of metallic foreign bodies of less than 20 nm in the past results of the production of the above chemical solution, the number of metallic foreign bodies being determined using LA-ICPMS.

It has been found that by using such a control method, metallic foreign bodies of less than 20 nm, that is, nanoparticles, that can be critical particles in an advanced process for forming a pattern of 20 nm or less can be controlled in various chemical solutions such as a wafer cleaning solution, a pre-wetting solution, a developing solution, and a rinsing solution used for coating a silicon substrate.

The control method is effective also for a chemical solution containing any one metal element in an amount of more than 10 ppb by mass, but since the purity range where ultrafine foreign matter of less than 20 nm is dominant is 10 ppb by mass or less, such a chemical solution cannot be controlled by conventional technology; thus, the above-described control method is a more effective control method.

Device Production

The following lithography step was performed using the above chemical solution confirmed to be not more than the control allowable value. The number of defects was measured after the lithography step. It was confirmed that the number of defects after the lithography step was clearly small when the chemical solution confirmed to be in the acceptable range was used.

The number of defects after the lithography step was measured by ashing the resist subjected to the lithography with oxygen plasma by using a TactrasVigus etch system manufactured by Tokyo Electron Ltd., and then performing optical defect inspection by using a surface inspection system (SurfScan SP5; manufactured by KLA Corporation). The results are shown in the column of "Number of NP (≤20 nm) after lithography" of Table 2 below. In Table 2 below, ≤20 nm indicates that the size of nanoparticles is 20 nm or less.

Lithography Step

First, a silicon substrate having a diameter of about 300 mm (12 inches) was pre-wetted with cyclohexanone (CHN). Next, a resist resin composition was spin-coated onto the pre-wet silicon substrate. Thereafter, heat drying was performed at a temperature of 150° C. for 90 seconds on a hot plate to form a resist film having a thickness of 90 nm.

Using an ArF excimer laser scanner (manufactured by ASML, XT: 1700i, wavelength: 193 nm), the resist film was subjected to pattern exposure under the exposure conditions of NA=1.20, Dipole (oσ/iσ)=0.981/0.859, and Y polarization, through a mask having a line-and-space pattern that would form a pattern having a line width of 45 nm and a space width of 45 nm after reduced projection exposure and development. After the irradiation, baking was performed at a temperature of 120° C. for 60 seconds. Thereafter, development and rinsing were performed, and baking was performed at a temperature of 110° C. for 60 seconds to form a resist pattern having a line width of 45 nm and a space width of 45 nm.

The resist resin composition used was the following one.

Resist Resin Composition

The resist resin composition will be described. The resist resin composition was obtained by mixing the following components.

Acid decomposable resin (resin represented by formula below (weight average molecular weight (Mw), 7,500); numerical values in repeating units indicate mol %): 100 parts by mass

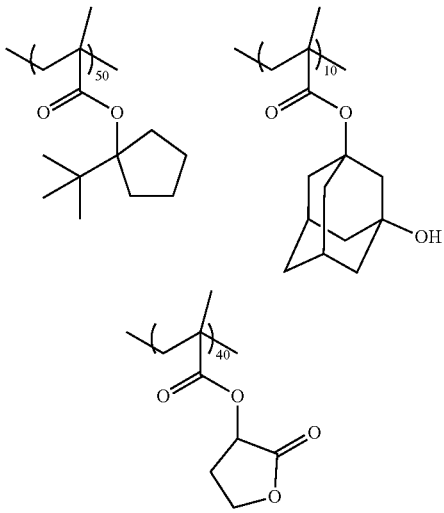

Photoacid generator shown below: 8 parts by mass

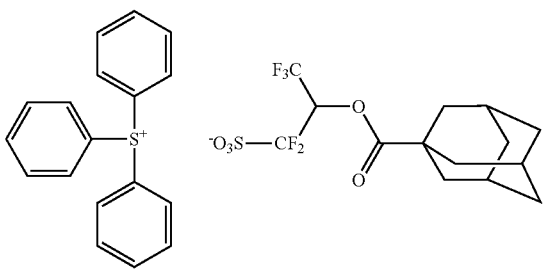

Quenchers shown below: 5 parts by mass (the mass ratio is 0.1:0.3:0.3:0.2 from the left.) Among the following quenchers, the polymer-type one has a weight average molecular weight (Mw) of 5,000. Numerical values in repeating units indicate molar ratios.

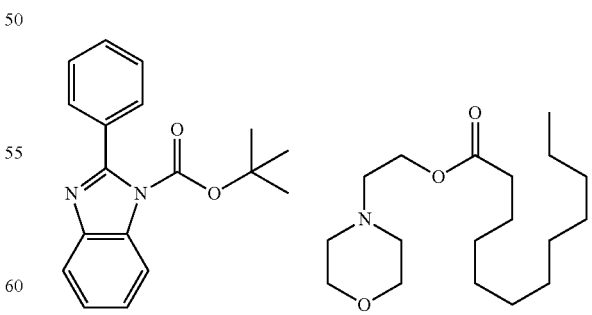

-continued

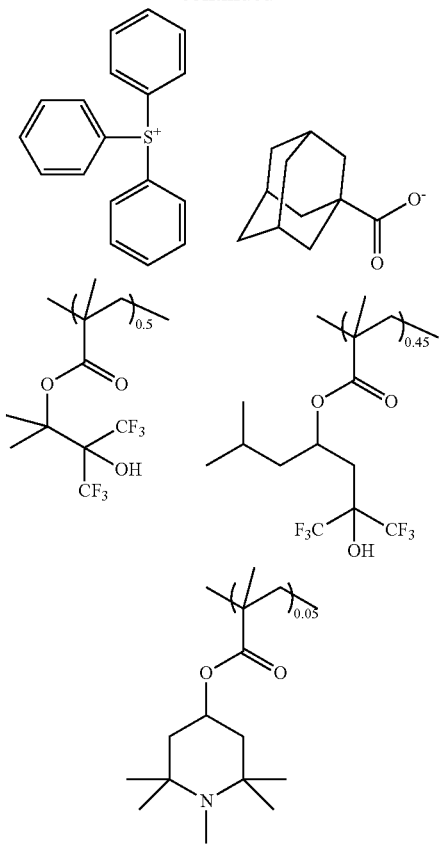

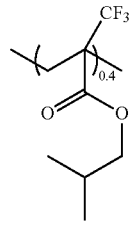

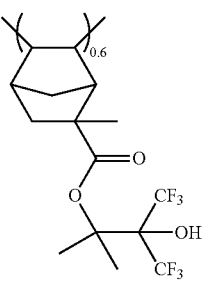

Solvent:

Propylene glycol monomethyl ether acetate (PGMEA): 3 parts by mass

Cyclohexanone: 600 parts by mass

γ-Butyrolactone (γ-BL): 100 parts by mass

Hydrophobic resins shown below: 4 parts by mass (the mass ratio is (1):(2)=0.5:0.5.

Among the following hydrophobic resins, the hydrophobic resin of formula (1) has a weight average molecular weight (Mw) of 7,000, and the hydrophobic resin of formula (2) has a weight average molecular weight (Mw) of 8,000. In each hydrophobic resin, numerical values in repeating units indicate molar ratios.

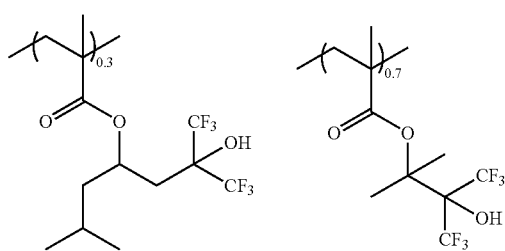

(1)

(2)

TABLE 2

| Table 2 | Composition used | Use | Number of NP (≤20 nm) | Allowability evaluation | Number of NP after lithography (≤20 nm) |
|---|---|---|---|---|---|
| Example 15 | PGMEA | Wafer cleaning | 56 | A | 108 |
| Example 16 | CHN | Pre-wetting | 25 | A | 83 |
| Example 17 | nBA | Development | 15 | A | 69 |
| Example 18 | MIBC | Rinsing | 90 | A | 145 |

Example C

Production of Resist Composition

The resist composition described in Example B above was used as a resist composition. The resist composition was purified by filtration.

Thereafter, a gallon bottle was filled with the purified resist composition and connected to a LITHIUS PRO (registered trademark) Z coater developer (manufactured by Tokyo Electron Ltd.). Furthermore, a silicon substrate having a diameter of about 300 mm (12 inches) was pre-wetted with cyclohexanone (CHN). Next, a resist resin composition was spin-coated onto the pre-wet silicon substrate. Thereafter, heat drying was performed at a temperature of 150° C. for 90 seconds on a hot plate to form a resist film having a thickness of 45 nm. The filtration conditions were adjusted so that Fe formed predominant nanoparticles on the silicon substrate. Trace metals were measured in advance with an Agilent 8900 ICP-MS system manufactured by Agilent Technologies Ltd.

Hereinafter, Examples 20 to 32 and Comparative Examples 20 to 23 will be described. The results of Examples 20 to 32 and Comparative Examples 20 to 23 are shown in Table 3 below.

In Examples 20 to 32, the resist composition was adjusted so that the number of particles on a silicon substrate having a diameter of 300 mm was as shown in the table. Using a coater developer, the adjusted resist composition was applied onto the silicon substrate having a diameter of 300 mm.

The silicon substrate coated with the resist composition was stored in a storage container capable of storing the entire silicon substrate and transported to a surface defect measuring unit.

As the surface defect measuring unit, a surface inspection system (SurfScan SP7; manufactured by KLA Corporation) was used. In the surface inspection system, by optical defect inspection, a laser beam was allowed to be incident on the surface of the silicon substrate, and scattered light was measured to determine the position and size of a defect on the silicon substrate. The obtained positional information and size information of the defect were stored in a storage unit.

Here, the silicon substrate used for the resist composition application was measured in advance for defect positional information and size with the surface inspection system (SurfScan SP7), and the difference between the number of foreign bodies after the resist composition application and the number of foreign bodies before the resist composition application was calculated as foreign bodies derived from the resist composition.

Next, the silicon substrate subjected to the surface defect measurement was transported to an analysis unit. As the analysis unit, a laser ablation ICP mass spectrometer (LA-ICP-MS) was used. In transporting the silicon substrate, the silicon substrate was loaded into a cell capable of housing the entire silicon substrate, and a carrier gas was allowed to flow into the cell.

On the basis of the obtained positional information and size information of the defect (klarf file), the elemental analysis of the defect by laser ablation was performed using the laser ablation ICP mass spectrometer, thus confirming that Fe was detectable at a predetermined position subjected to laser ablation.

The laser ablation was performed in a state where the silicon substrate was housed in the container and where the carrier gas was supplied. The analytical sample obtained by the laser ablation was collected using the carrier gas and subjected to inductively coupled plasma mass spectrometry. A femtosecond laser was used for the laser ablation.

Argon gas was used as the carrier gas. The flow rate of the carrier gas was $1.69 \times 10^{-2}$ Pa·m$^3$/sec (10 sccm). The water content of the carrier gas is shown in Table 3 below.

A front opening unified pod (FOUP) was used as the storage container for storing the semiconductor substrate.

Prior to the ablation, pre-cleaning was performed by flowing a cleaning gas into the cell at $1.69 \times 10^{-1}$ Pa·m$^3$/sec (100 sccm (standard cubic centimeter per minute)) for one minute.

Comparative Examples 20 to 23

In Comparative Examples 20 to 23, using the surface inspection system (SurfScan SP7; manufactured by KLA Corporation), a laser was allowed to be incident on the surface of the silicon substrate, and scattered light was measured to determine the position and size of a defect on the silicon substrate. The obtained positional information and size information of the defect were stored in a storage unit.

Next, in Comparative Examples 20 to 23, on the basis of the obtained positional information and size information of the defect, qualitative elemental analysis of the defect on the silicon substrate after being coated with the resist composition was attempted using a defect review system (SEMVision G6 (manufactured by Applied Materials, Inc.)). The qualitative elemental analysis of the defect on the silicon substrate after being coated with the resist composition in Comparative Examples 20 to 23 was performed using scanning electron microscope-energy dispersive X-ray spectroscopy (SEM-EDS). Since the SEM-EDS is performed using an electron beam under vacuum, no carrier gas is used. Thus, Comparative Examples 20 to 23 were marked with "-" in the column of "Water content of carrier gas" in Table 3 below. In Table 3 below, nanoparticle is denoted as "NP".

In Examples 20 to 32 and Comparative Examples 20 to 23, defect positional information and size were measured using the surface inspection system (SurfScan SP7) after the resist composition application. The results are shown in the column of "≤20 nm NP on substrate after resist composition application (SP7)".

In Examples 20 to 32 and Comparative Examples 20 to 23, defect positional information and size were measured using the surface inspection system (SurfScan SP7) after the defect measurement of the resist composition. The results are shown in the column of "≤20 nm NP on substrate after analysis (SP7)".

"Number of Fe detections in ≤20 nm NP" in Table 3 below shows the results of the defect measurement of the resist composition in Examples 20 to 32 and Comparative Examples 20 to 23. In Table 3 below, nanoparticle is denoted as "NP".

TABLE 3

| Table 3 | ≤20 nm NP on substrate after resist composition application (SP7) [number/substrate] Number of >20 nm NP in parentheses | Amount of Fe in resist composition (ppb by mass) | Water content of carrier gas (ppm by volume) | Number of Fe detections in ≤20 nm NP [number/substrate] Number of >20 nm NP in parentheses | ≤20 nm NP on substrate after analysis (SP7) [number/substrate] Number of >20 nm NP in parentheses |
|---|---|---|---|---|---|
| Example 20 | 228(52) | 0.03 | 0.001 | 212(52) | 0(5) |
| Example 21 | 335(88) | 0.05 | 0.001 | 308(88) | 0(2) |
| Example 22 | 423(91) | 0.07 | 0.001 | 420(90) | 0(6) |
| Example 23 | 298(61) | 0.03 | 0.1 | 290(61) | 0(6) |
| Example 24 | 331(83) | 0.05 | 0.1 | 320(82) | 0(2) |
| Example 25 | 493(99) | 0.07 | 0.1 | 471(99) | 0(8) |
| Example 26 | 221(52) | 0.03 | 10 | 209(52) | 0(390) |

TABLE 3-continued

| Table 3 | ≤20 nm NP on substrate after resist composition application (SP7) [number/substrate] Number of >20 nm NP in parentheses | Amount of Fe in resist composition (ppb by mass) | Water content of carrier gas (ppm by volume) | Number of Fe detections in ≤20 nm NP [number/substrate] Number of >20 nm NP in parentheses | ≤20 nm NP on substrate after analysis (SP7) [number/substrate] Number of >20 nm NP in parentheses |
|---|---|---|---|---|---|
| Example 27 | 333(91) | 0.05 | 10 | 331(91) | 0(401) |
| Example 28 | 491(95) | 0.07 | 10 | 491(95) | 0(409) |
| Example 29 | 252(52) | 0.03 | 0.000005 | 250(52) | 0(390) |
| Example 30 | 330(88) | 0.05 | 0.000005 | 329(88) | 0(399) |
| Example 31 | 462(91) | 0.07 | 0.000005 | 422(91) | 0(343) |
| Comparative Example 20 | 282(62) | 0.03 | — | 1(62) | 282(62) |
| Comparative Example 21 | 312(88) | 0.05 | — | 3(88) | 312(88) |
| Comparative Example 22 | 491(101) | 0.07 | — | 2(101) | 491(101) |
| Example 32 | 9403(2122) | 100 | 0.1 | 9401(2010) | 0(5) |
| Comparative Example 23 | 10082(2351) | 100 | — | 0(2319) | 10082(2351) |

In Examples 20 to 32, Fe elements were detected even in fine nanoparticle defects of 20 nm or less, thus showing that fine metallic foreign bodies in a produced chemical solution can be inspected. In contrast, Fe elements of 20 nm or less were hardly detected in Comparative Examples 20 to 23.

In Examples 20 to 32, the results comparable to those obtained using the surface inspection system (SurfScan SP7) were obtained in the defect measurement.

In Examples 20 to 32, LA-ICPMS was used. Thus, since the nanoparticles on the silicon substrate were ablated and disappeared as a result of the defect measurement, the nanoparticles were reduced after the defect measurement.

In Comparative Examples 20 to 23, SEM-EDX or SEM-EDS was used. Thus, the nanoparticles were not reduced after the defect measurement.

Furthermore, it was confirmed that by setting the water content of the carrier gas in the range of 0.00001 ppm by volume or more and 0.1 ppm by volume or less, adhesion of nanoparticles due to contamination of the silicon substrate surface during the measurement was suppressed, thus suppressing contamination. Thus, the effectiveness of the present invention was confirmed.

Example D

Production of Resist Composition

The resist composition described in Example B above was used as a resist composition.

For trace metals, each metal element was confirmed to be 10 ppb by mass or less.

Hereinafter, Example 33 will be described. The results of Example 33 are shown in Table 4 below.

Example 33

In Example 33, as in Examples 20 to 32 above, optical defect inspection was performed using a surface inspection system (SurfScan SP5; manufactured by KLA Corporation), and then inductively coupled plasma mass spectrometry was performed. The water content of the carrier gas was set to 0.1 ppm by volume.

Resist Composition Control

The control allowable value regarding the number of metallic foreign bodies on a silicon substrate coated with a resist composition was set as follows: the number of metallic foreign bodies of less than 20 nm is 500 or less per substrate.

Those satisfying the control allowable value are marked with "A" in the column of Allowability evaluation in Table 4 below, and those not satisfying the control allowable value are marked with "B" in the column of Allowability evaluation in Table 4 below. In Table 4 below, nanoparticle is denoted as "NP".

The control allowable value was determined by calculating the average +σ of the number of metallic foreign bodies of less than 20 nm in the past results of the production of the above resist composition, the number of metallic foreign bodies being determined using LA-ICPMS.

It has been found that by using such a control method, metallic foreign bodies of less than 20 nm that can be critical particles in an advanced process for forming a pattern of 20 nm or less can be controlled in a resist composition.

The control method is effective also for a resist composition containing any one metal element in an amount of more than 10 ppb by mass, but since the purity range where ultrafine foreign matter of less than 20 nm is dominant is 10 ppb by mass or less, such a resist composition cannot be controlled by conventional technology; thus, the above-described control method is a more effective control method.

Device Production

The same lithography step as in Example B above was performed using the above resist composition confirmed to be not more than the control allowable value. The number of defects was measured after the lithography step. It was confirmed that the number of defects after the lithography step was clearly small when the resist composition confirmed to be in the acceptable range was used.

The number of defects after the lithography step was measured by ashing the resist subjected to the lithography with oxygen plasma by using a TactrasVigus etch system manufactured by Tokyo Electron Ltd., and then performing optical defect inspection by using a surface inspection system (SurfScan SP5; manufactured by KLA Corporation). The results are shown in the column of "Number of NP after lithography" of Table 4 below. In Table 4 below, ≤20 nm indicates that the size of nanoparticles is 20 nm or less.

TABLE 4

| Table 4 | Composition used | Number of NP (≤20 nm) | Allowability evaluation | Number of NP after lithography (≤20 nm) |
|---|---|---|---|---|
| Example 33 | Resist | 325 | A | 448 |

Example E

Production of Chemical Solution

First, a cleaning chemical solution (propylene glycol monomethyl ether acetate (PGMEA)) used in Example described later was prepared. Specifically, first, a high-purity grade organic solvent reagent having a purity of 99 mass % or more was purchased. The purchased reagent was then subjected to a filtration treatment using an appropriate combination of the following filters to prepare a cleaning chemical solution.

IEX-PTFE (15 nm): 15 nm IEX PTFE manufactured by Entegris, Inc.
PTEE (12 nm): 12 nm PTFE manufactured by Entegris, Inc.
UPE (3 nm): 3 nm PE filter manufactured by Entegris, Inc.

To adjust the amount of impurities in the cleaning chemical solution described later, the supplier or purity grade of the organic solvent reagent was changed, or a distillation treatment was performed before the filtration treatment, as appropriate. The conditions were adjusted so that a metal of 20 nm or less formed predominant nanoparticles on a silicon substrate.

Performance Verification of Cleaning Chemical Solution

A gallon bottle was filled with the cleaning chemical solution described above and connected to a thoroughly cleaned LITHIUS PRO (registered trademark) Z coater developer (manufactured by Tokyo Electron Ltd.). After the connection, the cleaning chemical solution was applied onto a silicon substrate having a diameter of about 300 mm (12 inches), and the silicon substrate was recovered.

The silicon substrate recovered was measured as described below, and 50 metal element nanoparticles of 20 nm or less were detected on the silicon substrate.

The silicon substrate recovered was stored in a storage container capable of storing the entire silicon substrate and transported to a surface defect measuring unit.

As the surface defect measuring unit, a surface inspection system (SurfScan SP5; manufactured by KLA Corporation) was used. In the surface inspection system, by optical defect inspection, a laser beam was allowed to be incident on the surface of the silicon substrate, and scattered light was measured to determine the position and size of a defect on the silicon substrate. The obtained positional information and size information of the defect were stored in a storage unit.

Next, the silicon substrate subjected to the surface defect measurement was transported to an analysis unit. As the analysis unit, a laser ablation ICP mass spectrometer (LA-ICP-MS) was used. In transporting the silicon substrate, the silicon substrate was loaded into a cell capable of housing the entire silicon substrate, and a carrier gas was allowed to flow into the cell.

On the basis of the obtained positional information and size information of the defect (klarf file), the elemental analysis of the defect by laser ablation was performed using the laser ablation ICP mass spectrometer.

The laser ablation was performed in a state where the silicon substrate was housed in the container and where the carrier gas was supplied. The analytical sample obtained by the laser ablation was collected using the carrier gas and subjected to inductively coupled plasma mass spectrometry. A femtosecond laser was used for the laser ablation.

Argon gas was used as the carrier gas. The flow rate of the carrier gas was $1.69 \times 10^{-2}$ Pa·m$^3$/sec (10 sccm).

Prior to the ablation, pre-cleaning was performed by flowing a cleaning gas into the cell at $1.69 \times 10^{-1}$ Pa·m$^3$/sec (100 sccm (standard cubic centimeter per minute)) for one minute.

Method of Determining Degree of Contamination of Semiconductor Manufacturing Apparatus A gallon bottle was filled with the cleaning chemical solution and connected to an uncleaned LITHIUS PRO (registered trademark) Z coater developer (manufactured by Tokyo Electron Ltd.). After the connection, the cleaning chemical solution was applied onto a silicon substrate having a diameter of about 300 mm (12 inches).

At this time, each time a feed amount of 1 L (1,000 mL) was flowed, 10 mL of the cleaning chemical solution was applied onto a silicon substrate, and the silicon substrate was recovered and measured as described above to attempt detection of metal element nanoparticles. When the gallon bottle ran out of the cleaning chemical solution, it was replaced with a new gallon bottle filled with the cleaning chemical solution. The number of detected metal element nanoparticles at each feed amount is shown in Table 5 below.

TABLE 5

| Feed amount (mL) | Number of detected metal element nanoparticles on silicon substrate |
|---|---|
| 10 (corresponding to initial state of apparatus) | 11056 |
| 1000 | 1056 |
| 2000 | 502 |
| 3000 | 215 |
| 4000 | 72 |
| 5000 | 49 |
| 6000 | 50 |
| 7000 | 48 |

As shown in Table 5, as the amount of feed to the coater developer was increased, the number of detected metal element nanoparticles in the cleaning chemical solution used for cleaning was decreased. That is, it was confirmed that the contamination status of the coater developer was improved.

REFERENCE SIGNS LIST

10, 10a, 10b analyzer
12a first transport chamber
12b measurement chamber 12c second transport chamber
12d analysis chamber
12e process chamber
12g introduction unit
12h wall
13 storage container
14 transport device
14a mount
15 transport arm
16 transport device
16a mount
20 surface defect measuring unit
22, 32 stage
23 light casting unit
24 condensing lens
25, 26 light-receiving unit
27 condensing lens
28 arithmetic unit
29 storage unit
30 analysis unit
33 container
34 light source
35 condensing lens
36 analyzing unit
38 carrier gas supply unit
39 pipe
40 cleaning gas supply unit
41 outlet
42 control unit
44 plasma torch
46 mass spectrometry section
46a ion lens section
46b mass spectrometer section
47 ion lens
48 reflectron
49 detector
50 semiconductor substrate
50a surface
51 defect
51a analytical sample
70 surface defect measuring device
72 mass spectrometer
$C_1$, $C_2$, $C_3$ rotational axis
H direction
La laser beam
Ls incident light
S10, S12, S14, S16, S18, S20 Step
S22, S23, S24, S26, S27, S28 Step
S30, S32, S34, S36, S38, S40 Step
S42, S43, S44, S46, S48, S50 Step
S52, S54, S56, S58, S60, S62 Step
S64, S66, S68 Step
V height direction

What is claimed is:

1. A method for inspecting a chemical solution, comprising:
  a step 1X of preparing a chemical solution;
  a step 2X of applying the chemical solution onto a semiconductor substrate; and
  a step 3X, comprising:
    (i) a surface defect measuring step, including measuring whether there is a defect on a surface of the semiconductor substrate to obtain positional information of the defect on the surface of the semiconductor substrate, and
    (ii) an analysis step, including irradiating the defect on the surface of the semiconductor substrate with a laser beam based on the positional information obtained from step (i), collecting an analytical sample obtained by the irradiation by using a carrier gas, and subjecting the analytical sample to inductively coupled plasma mass spectrometry.

2. The method for inspecting a chemical solution according to claim 1, comprising a step 4X of determining whether there is a metal element in the defect from mass spectrometry data of the defect obtained in the step 3X.

3. The method for inspecting a chemical solution according to claim 2, comprising, after the step 4X, a step 5X of measuring the number of defects containing the metal element.

4. The method for inspecting a chemical solution according to claim 1, comprising a step 5X of measuring the number of defects containing a metal element based on mass spectrometry data of the defect obtained in the step 3X.

5. The method for inspecting a chemical solution according to claim 1, wherein the chemical solution contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the chemical solution.

6. The method for inspecting a chemical solution according to claim 1, wherein the carrier gas has a water content of 0.00001 ppm by volume or more and 0.1 ppm by volume or less.

7. A method for producing a chemical solution, comprising the method for inspecting a chemical solution according to claim 1.

8. A method for controlling a chemical solution, comprising:
  a step 1X of preparing a chemical solution;
  a step 2X of applying the chemical solution onto a semiconductor substrate;
  a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry;
  a step 4X of determining whether there is a metal element in the defect from mass spectrometry data of the defect obtained in the step 3X and a step 5X of measuring the number of defects containing the metal element, or
  a step 5X of measuring the number of defects containing a metal element based on mass spectrometry data of the defect obtained in the step 3X; and
  a step 6X of determining whether the number of defects obtained in the step 5X is within an acceptable range.

9. The method for controlling a chemical solution according to claim 8, wherein the chemical solution contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the chemical solution.

10. The method for controlling a chemical solution according to claim 8, wherein the carrier gas has a water content of 0.00001 ppm by volume or more and 0.1 ppm by volume or less.

11. A method for producing a semiconductor device, comprising:
  a step 1X of preparing a chemical solution;

a step 2X of applying the chemical solution onto a semiconductor substrate;

a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry;

a step 4X of determining whether there is a metal element in the defect from mass spectrometry data of the defect obtained in the step 3X and a step 5X of measuring the number of defects containing the metal element, or a step 5X of measuring the number of defects containing a metal element based on mass spectrometry data of the defect obtained in the step 3X;

a step 6X of determining whether the number of defects obtained in the step 5X is within an acceptable range; and a step 7X of producing a semiconductor device by using a chemical solution determined to be within the acceptable range in the step 6X.

12. The method for producing a semiconductor device according to claim 11, wherein the chemical solution is a pre-wetting solution, a developing solution, a rinsing solution, or a cleaning solution.

13. The method for producing a semiconductor device according to claim 11, wherein the chemical solution contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the chemical solution.

14. The method for producing a semiconductor device according to claim 11, wherein the carrier gas has a water content of 0.00001 ppm by volume or more and 0.1 ppm by volume or less.

15. A method for inspecting a resist composition, comprising:
a step 1Y of preparing a resist composition;
a step 2Y of applying the resist composition onto a semiconductor substrate; and
a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry.

16. The method for inspecting a resist composition according to claim 15, comprising a step 4Y of determining whether there is a metal element in the defect from mass spectrometry data of the defect obtained in the step 3Y.

17. The method for inspecting a resist composition according to claim 16, comprising, after the step 4Y, a step 5Y of measuring the number of defects containing the metal element.

18. The method for inspecting a resist composition according to claim 15, comprising a step 5Y of measuring the number of defects containing a metal element based on mass spectrometry data of the defect obtained in the step 3Y.

19. The method for inspecting a resist composition according to claim 15, wherein the resist composition contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the resist composition.

20. The method for inspecting a resist composition according to claim 15, wherein the carrier gas has a water content of 0.00001 ppm by volume or more and 0.1 ppm by volume or less.

21. A method for producing a resist composition, comprising the method for inspecting a resist composition according to claim 15.

22. A method for controlling a resist composition, comprising:
a step 1Y of preparing a resist composition;
a step 2Y of applying the resist composition onto a semiconductor substrate;
a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry;
a step 4Y of determining whether there is a metal element in the defect from mass spectrometry data of the defect obtained in the step 3Y and a step 5Y of measuring the number of defects containing the metal element, or
a step 5Y of measuring the number of defects containing a metal element based on mass spectrometry data of the defect obtained in the step 3Y; and
a step 6Y of determining whether the number of defects obtained in the step 5Y is within an acceptable range.

23. The method for controlling a resist composition according to claim 22, wherein the resist composition contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the resist composition.

24. The method for controlling a resist composition according to claim 22, wherein the carrier gas has a water content of 0.00001 ppm by volume or more and 0.1 ppm by volume or less.

25. A method for producing a semiconductor device, comprising:
a step 1Y of preparing a resist composition;
a step 2Y of applying the resist composition onto a semiconductor substrate;
a step 3Y of measuring whether there is a defect in a coating of the resist composition to obtain positional information of the defect in the coating of the resist composition on the semiconductor substrate, irradiating, based on the positional information, the defect on a surface of the semiconductor substrate with a laser beam, collecting an analytical sample obtained by the irradiation by using a carrier gas, and subjecting the analytical sample to inductively coupled plasma mass spectrometry;
a step 4Y of determining whether there is a metal element in the defect from mass spectrometry data of the defect obtained in the step 3Y and a step 5Y of measuring the number of defects containing the metal element, or a step 5Y of measuring the number of defects containing a metal element based on mass spectrometry data of the defect obtained in the step 3Y;

a step 6Y of determining whether the number of defects obtained in the step 5Y is within an acceptable range; and a step 7Y of producing a semiconductor device by using a resist composition determined to be within the acceptable range in the step 6Y.

26. The method for producing a semiconductor device according to claim 25, wherein the resist composition contains at least one metal element selected from the group consisting of Na, K, Ca, Fe, Cu, Mg, Mn, Li, Al, Cr, Ni, Ti, and Zn, and a total content of the metal element is 10 ppb by mass or less relative to a total mass of the resist composition.

27. The method for producing a semiconductor device according to claim 25, wherein the carrier gas has a water content of 0.00001 ppm by volume or more and 0.1 ppm by volume or less.

28. A method for checking a contamination status of a semiconductor manufacturing apparatus, comprising:

a step 1Z of preparing a chemical solution;

a step 2Z of cleaning a semiconductor manufacturing apparatus by using the chemical solution;

a step 3Z of applying the chemical solution after the cleaning in the step 2Z onto a semiconductor substrate;

a step 4Z of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; and a step 5Z of determining whether there is a metal element in the defect from mass spectrometry data of the defect obtained in the step 4Z.

29. The method for checking a contamination status of a semiconductor manufacturing apparatus according to claim 28, comprising a step 6Z of measuring the number of defects containing the metal element.

30. A method for checking a contamination status of a semiconductor manufacturing apparatus, comprising:

a step 1Z of preparing a chemical solution;

a step 2Z of cleaning a semiconductor manufacturing apparatus by using the chemical solution;

a step 3Z of applying the chemical solution after the cleaning in the step 2Z onto a semiconductor substrate;

a step 4Z of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry; and a step 6Z of measuring the number of defects containing a metal element based on mass spectrometry data of the defect obtained in the step 4Z.

31. The method for checking a contamination status of a semiconductor manufacturing apparatus according to claim 28, wherein the carrier gas has a water content of 0.00001 ppm by volume or more and 0.1 ppm by volume or less.

32. A method for inspecting a chemical solution, comprising:

a step 1X of preparing a chemical solution;

a step 2X of applying the chemical solution onto a semiconductor substrate; and a step 3X of measuring whether there is a defect on a surface of the semiconductor substrate to obtain positional information of the defect on the surface of the semiconductor substrate, irradiating, based on the positional information, the defect on the surface of the semiconductor substrate with a laser beam, collecting an analytical sample obtained by the irradiation by using a carrier gas, and subjecting the analytical sample to inductively coupled plasma mass spectrometry, wherein the carrier gas has a water content of 0.00001 ppm by volume or more and 0.1 ppm by volume or less.

* * * * *